(12) United States Patent
Shizawa et al.

(10) Patent No.: US 7,841,035 B2
(45) Date of Patent: Nov. 30, 2010

(54) DISC CLEANING MACHINERY, DISC CLEANING DEVICE THEREOF AND ROTARY BRUSH THEREOF

(75) Inventors: Noritake Shizawa, Kanagawa (JP); Toshimitsu Shiraishi, Kanagawa (JP); Tatsuo Kaneko, Kanagawa (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1073 days.

(21) Appl. No.: 11/548,841

(22) Filed: Oct. 12, 2006

(65) Prior Publication Data

US 2007/0084004 A1  Apr. 19, 2007

(30) Foreign Application Priority Data

Oct. 13, 2005 (JP) ............................. 2005-298774
Oct. 28, 2005 (JP) ............................. 2005-314027
Apr. 26, 2006 (JP) ............................. 2006-121649

(51) Int. Cl.
  *B08B 11/02* (2006.01)
(52) U.S. Cl. .............................. 15/77; 15/88.2; 15/88.3; 15/102
(58) Field of Classification Search ...................... 15/77, 15/88.2, 88.3, 102
See application file for complete search history.

(56) References Cited

U.S. PATENT DOCUMENTS 5,870,792 A * 2/1999 Shurtliff ...................... 15/102
6,055,694 A * 5/2000 Steere ............................ 15/77
6,112,355 A * 9/2000 Tsuchida et al. ................ 15/77

FOREIGN PATENT DOCUMENTS

| JP | 61-8734 A | 1/1986 |
|----|-----------|--------|
| JP | 1-254110 A | 10/1989 |
| JP | 9-29188 A | 2/1997 |
| JP | 11-57630 A | 3/1999 |
| JP | 11-90359 A | 4/1999 |
| JP | 11-129349 | 5/1999 |
| JP | 11-169801 A | 6/1999 |
| JP | 11-207271 A | 8/1999 |
| JP | 2000-11374 A | 1/2000 |
| JP | 2001-29905 | 2/2001 |
| JP | 2001-96245 | 4/2001 |
| JP | 2001-191038 A | 7/2001 |
| JP | 2001-524021 A | 11/2001 |
| JP | 2006-75718 A | 3/2006 |

* cited by examiner

*Primary Examiner*—Randall Chin
(74) *Attorney, Agent, or Firm*—Mattingly & Malur, P.C.

(57) ABSTRACT

A disc cleaning mechanism or device has a rotary brush having a rotary shaft on which a plurality of brushes are mounted and, between adjacent brushes of which a plurality of discs is inserted, and a disc revolution stopper for preventing the discs inserted between the brushes from revolving about the rotary shaft by rotation of the rotary brush and allowing the discs to rotate. The disc cleaning mechanism includes a core roller having an uneven inner peripheral portion of the brush as a core of the brush and an uneven outer peripheral portion and a rotary shaft on which a plurality of the core rollers are mounted. The brush and the core rollers constitute a spline joint.

14 Claims, 11 Drawing Sheets

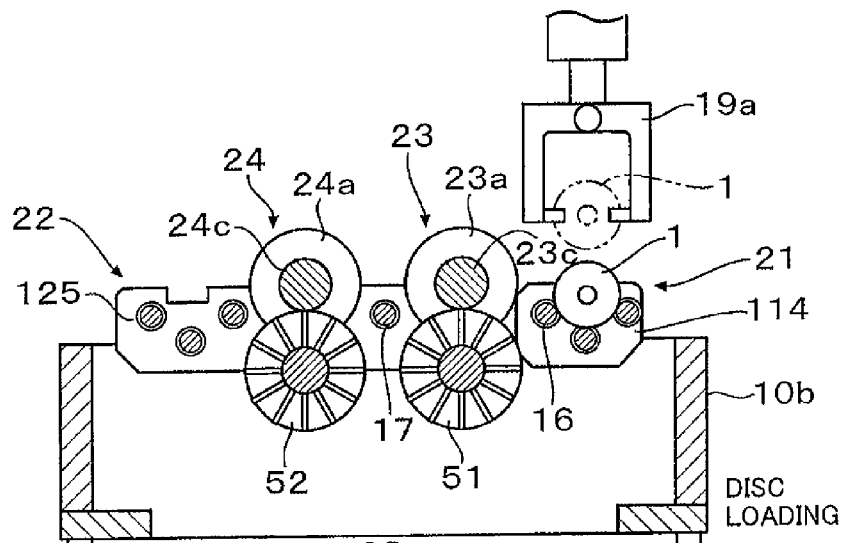
FIG. 9A  DISC LOADING
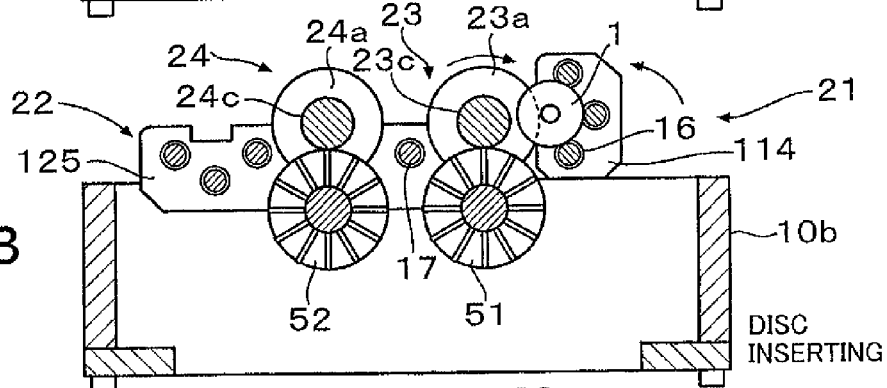
FIG. 9B  DISC INSERTING
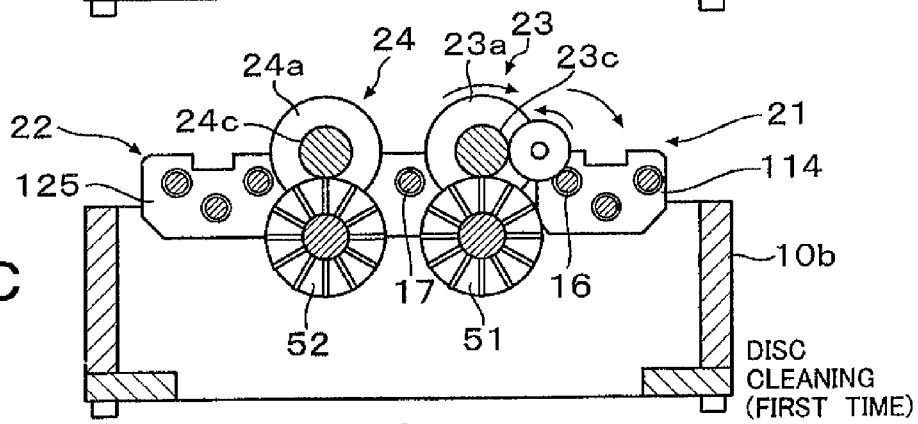
FIG. 9C  DISC CLEANING (FIRST TIME)
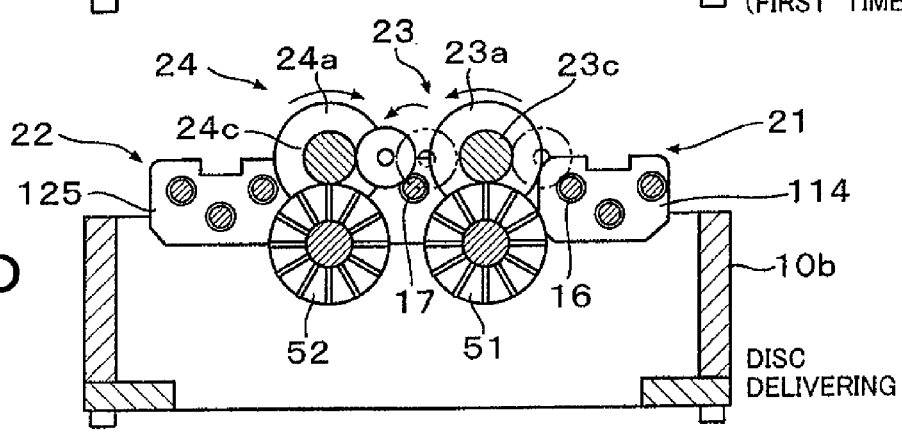
FIG. 9D  DISC DELIVERING

DISC CLEANING (SECOND TIME)

DISC DISCHARGING

DISC UNLOADING

DISC CLEANING MACHINERY, DISC CLEANING DEVICE THEREOF AND ROTARY BRUSH THEREOF

TECHNICAL FIELD

This invention relates to a disc cleaning machine, a disc cleaner thereof and a rotary brush thereof and, particularly, in a disc cleaner for scrubbing a disc such as a wafer, hard disc or optical disc, this invention relates to a disc cleaning machine, with which a batch of discs can be scrubbed simultaneously, throughput of cleaning can be improved and the size thereof can be minimized.

BACKGROUND ART

A substrate of, for example, a hard disc, is scrubbed after steps of grinding, polishing, sputtering and plating, etc. On the other hand, the cleaning of such as wafer includes a plurality of cleaning steps and a corresponding number of drying steps.

In a known scrubbing device, the scrubbing step is performed by dipping a carrier (or a tray), on which a plurality of discs are vertically mounted, in a tab filled with cleaning agent and applying ultra sonic waves thereto. In such a case, the cleaned discs are dried by transporting the carrier (or tray) into a drying chamber.

On the other hand, JP2001-96245A discloses a cleaning device, which includes a conveyer covering a shower tab, a cleaning agent tab, an ultrasonic wave tab and a pure water tab, respectively, to convey discs from the shower tab to the pure water tab, sequentially.

Further, JP2001-29905A discloses a technique for cleaning discs, in which a plurality of radially arranged cleaning chambers, each including a brush cleaning chamber (for scrubbing the discs using brushes), a jet cleaning chamber and a shower cleaning chamber are used. In this technique, the discs are arranged vertically on a turntable and one of the cleaning chambers is selectively activated corresponding to the degree of contamination of the discs by rotating the turntable.

JP-H11-129349A discloses a technique for scrubbing a number of discs simultaneously, in which a number of circular brush plates are arranged on a shaft at equal intervals as a rotary brush and a portion of each of the discs is caught between adjacent circular brush plates.

Incidentally, in the brush cleaning, it is typical that the cleaning is performed by using porous elastic sponge members (referred to as "sponge members", hereinafter) instead of the usual brushes and rotating discs having surfaces in contact with the sponge members. In this specification, the sponge member is included in the concept of the brush.

Nowadays, the hard disc is used in the fields of such as automobile appliances, home appliances and audio appliances and the hard disc drive devices for 2.5 inch to 1.8 inch or less than 1.0 inch discs are provided within various appliances and there is a tendency of reduction of size of the hard disc device. Further, the unit cost of the hard disc drive device itself is lowered. Therefore, manufacturers of hard disc devices require the fabrication of a large quantity of low cost hard disc drives.

For this reason, a disc cleaning device capable of cleaning a large quantity of discs simultaneously is required. However, although the disc cleaning device mentioned above can perform batch processing, the scrubbing portion thereof is only of the sheet-fed type in which the discs are cleaned individually. Therefore, in view of the request of simultaneous cleaning of 2.5 inch discs or smaller, the prior art sheet-fed type disc cleaning device is not appropriate.

Further, since the rotary brush used in the scrubbing type cleaning has to contact one of opposite surfaces of the disc, it is usual that independent rotary shafts for the discs and the rotary brushes are necessary, so that the size of the cleaning machine is increased. In addition to this, since the rotary shaft is inserted into centers of the discs, it is impossible to sufficiently clean internal portions of the discs.

Although the technique described in JP-H11-129349A performs the scrubbing cleaning of the discs by using the circular brush plates having a large diameter and arranged on the shaft at equal intervals, the independent rotary shafts are required for the discs and the rotary brushes, respectively. Further, since it is necessary to provide the large circular brush plates independently and to externally contact top end portions of the large circular brush plates with the surfaces of the discs, the size of the cleaning machine is increased. Therefore, the machine is not suitable to clean compact discs.

SUMMARY OF THE INVENTION

An object of the present invention is to provide a disc cleaning machine capable of scrubbing discs in the batch and improving the throughput of cleaning processing, while reducing the size of the machine.

Another object of the present invention is to provide a disc cleaning machine suitable to clean compact discs, surfaces of which are hardly textured or scratched.

A further object of the present invention is to provide a disc cleaning device, which is suitable to clean compact discs and the size of which can be reduced.

A still further object of the present invention is to provide a disc cleaning brush suitable to clean compact discs.

According to a first aspect of the present invention, a disc cleaning machine or a disc cleaning device for cleaning disc by contacting brushes with surfaces of the disc and rotating the brushes, comprises a rotary brush assembly having a rotary shaft and a plurality of brushes which are disc shaped or circular or cylindrical shape, mounted on the rotary shaft such that the discs are inserted to positions between adjacent the brushes and a disc revolution stopper for preventing revolution of the discs inserted to the positions about the rotary shaft by rotation of the rotary brush assembly by engagement of the disc revolution stopper with outer peripheries of the discs and allowing rotation of the discs.

According to a second aspect of the present invention, a disc cleaning machine for cleaning discs by contacting brushes with surfaces of the discs and rotating the brushes, comprises a plurality of core rollers having uneven outer peripheral portions and forming cores of the brushes and a rotary shaft inserted into the core rollers, wherein the brushes are disc shaped or circular or cylindrical shape and have center openings having uneven inner peripheral portions joined with the uneven outer periphery of the rotary brush assembly to form a spline joint in the axial direction of the core roller between the brushes and the core rollers.

In the disc cleaning machine according to the first aspect of the present invention, a plurality of the brushes in the form of circular plates having a predetermined thickness are mounted on the rotary shaft and at least one of the discs is inserted between adjacent circular plates and held thereby. When the rotary brush is rotated, the thus held disc revolves about the rotary shaft. In the first aspect, since the disc revolution stopper for preventing the discs from revolving by engagement of the stopper with the outer peripheries of the discs is provided, it is possible to prevent the revolution of the discs while allowing the discs to rotate correspondingly to the rotation of the brushes.

Therefore, the discs can be rotated even without a rotary shaft provided in centers of the discs and the cleaning of inner peripheral portions or portions in the vicinity thereof of the discs becomes possible. Further, since there is no need of providing the rotary shaft for rotating the discs, it is possible to reduce the size of the disc cleaning machine.

In particular, according to the first aspect of the present invention, by providing a plurality (n) of the brushes, inserting the discs between adjacent ones of the brushes and providing grooves on the side of the rotary shaft correspondingly to the inserting positions, it is possible to transmit a rotation to the (n) discs through the grooves, where n is an integer equal to or large than 3. In such case, it is possible to facilitate rotation of the discs. Further, when the revolution stopper is constituted with a roller or a grooved roller shaft, frictional force between the brushes and the discs becomes stable since the positions, in which the n discs are held while rotating, are stabilized by the grooves. Therefore, it is possible to regulate frictional force to a small value with which discs are not damaged.

Further, according to the first aspect of the present invention, the rotary shaft, the shaft of the disc revolution stopper and another shaft are provided for 3-point chucking of discs. Therefore, it is possible to rotate a plurality of discs while being 3-point of outer peripheral of the disc chucked by the three shafts, and it is possible to regulate frictional force between the discs and the rotary brush assembly to a small value by driving them through the rotary shafts. Further, it is possible to rotate discs without diameter limitation thereof and without a center shaft.

In the first aspect of the present invention, it is possible to start the scrubbing of the discs when the rotary shaft of the brushes is rotated. Therefore, it is possible to shift the operation to the scrubbing state almost immediately to thereby improve the throughput.

In addition, since the discs are held between brushing surfaces of adjacent circular brush plates or cylindrical brushes, compact discs having diameter 2.5 inches or smaller can be held more easily. Therefore, by employing a single rotary shaft for driving the rotary brush having circular brush plates or cylindrical brushes and a structure for intimately loading a plurality of brushes, the whole cleaning machine or device can be made smaller.

As a result, it becomes possible to scrub a batch of discs and to thereby clean the discs simultaneously, so that it is possible to realize a disc cleaning machine suitable to improve the throughput of cleaning processing and to reduce the size of the cleaning device.

On the other hand, according to the second aspect of the present invention, the uneven peripheral portions constituting the axial spline joint between the brushes and the core rollers having the brushes mounted thereon are provided in them, respectively. Therefore, during the cleaning operation, the brushes can move axially of the core roller, so that the brushes between the discs can move to positions, in which contact pressure are uniform by counter action of the discs on both sides.

In particular, when a construction, in which brush cleaner circular plates are provided and the circular plates are inserted between brushes in positions out of the disc insertion positions is employed, it is possible to move the brushes to the positions, in which the contact pressure is uniform, by the action of the brush cleaner circular plates. Thus, when a number of brushes are provided, the contact pressure with respect to the respective discs becomes uniform further.

As a result, according to the second aspect of the present invention, the contact pressure of the respective disc cleaning brushes with respect to the discs can be maintained uniformly, so that the cleaning efficiency is improved, the number of discs, which should be cleaned again, is reduced and textures or other scratches are hardly formed on the disc surfaces.

BRIEF DESCRIPTION OF THE DRAWINGS

FIG. 9A shows a disc loading mechanism receiving vertically standing discs from a disc delivering hand;

FIG. 9B shoes disc receiving shafts of the disc loading mechanism rotated counterclockwise by about 90°;

FIG. 9C shows the disc loading mechanism rotated clockwise and returned to the original position;

FIG. 9D shows core rollers of the rotary brush unit rotated counterclockwise;

DESCRIPTION OF THE PREFERRED EMBODIMENTS

Embodiment 1

Figure 1A:
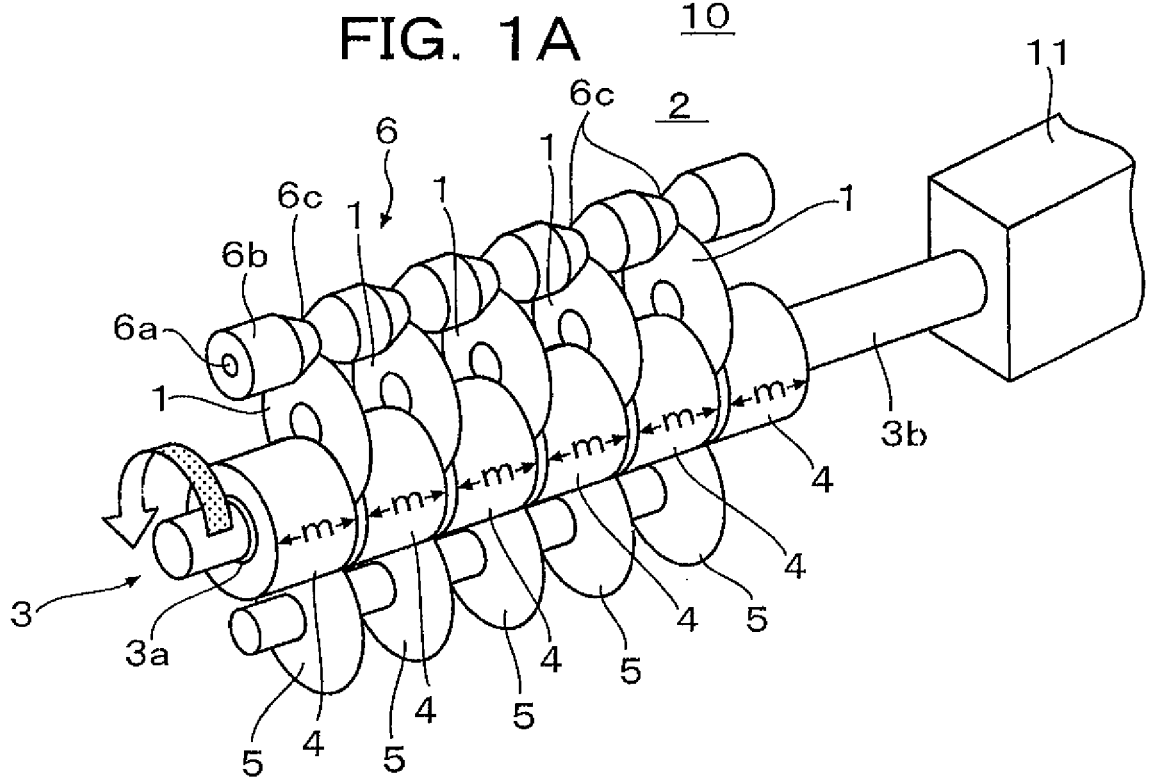
FIG. 1A is a perspective view of a cleaning portion of a disc cleaning device according to an embodiment of the present invention.
Figure 1B:
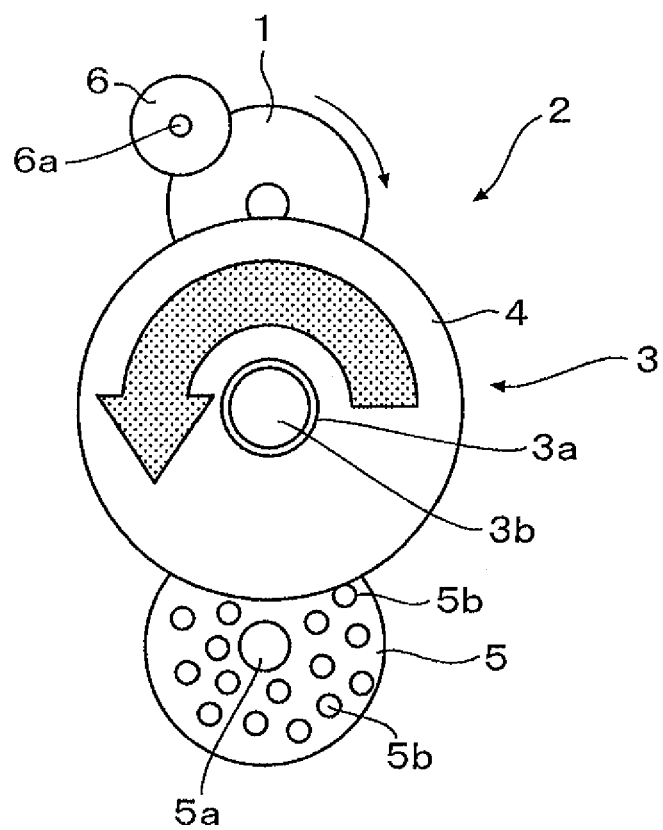
FIG. 1B is a vertical cross section of the cleaning portion shown in FIG. 1A.

In FIGS. 1A and 1B, a reference numeral 10 depicts a disc cleaning device (an internal portion of a scrubbing chamber thereof) including discs to be cleaned, a cleaning device 2, a rotary brush unit 3, disc-shaped brushes 4 each constructed by a porous sponge member formed of PVA (polyvinyl alcohol), thickness of which is m. The brushes 4 are mounted on a roller 3a. The rotary blush unit 3 is constructed with the brushes 4, a rotary shaft 3b and the roller 3a.

The roller 3a has a sleeve fixedly mounted on the rotary shaft 3b and the sleeve is rotated by rotation of the rotary shaft 3b. The roller 3a is constructed with the sleeve and the rotary shaft 3b. As shown in FIG. 2B, grooves 3c are formed on the sleeve of the roller 3a in contact positions S corresponding to portions with which surfaces of adjacent brushes 4 are in contact. The rotary shaft 3b rotates the discs 1 through frictional force due to rotation of the brushes 4 and the grooves 3c.

As shown in FIG. 1B, when the rotary shaft 3b rotates counterclockwise, the brushes 4 rotate counterclockwise and the discs 1 caught between adjacent brushes 4 rotate clockwise due to frictional engagement with the brushes 4. The grooves 3c work to stabilize the rotation of the discs 1.

The disc cleaning device 2 includes a disc revolution stopper 6 provided on one side of each of the discs 1 caught between adjacent ones of the brushes 4. As shown in FIG. 1A, the disc revolution stopper 6 engages with outer peripheries of the discs 1 to prevent revolution of the discs 1 about the rotary shaft 3b due to rotation of the brushes 4 and to rotate the discs 1 while regulating frictional force between the discs 1 and the rotary brushes 4 such that the discs 1 are not scratched.

The disc revolution stopper 6 is constructed with a shaft 6a provided in parallel to the rotary shaft 3b and rollers 6b provided on the shaft 6a. Grooves 6c of the rollers 6b are provided correspondingly to the discs 1 in the contact portions S (refer to FIG. 2B) such that the grooves 6c contact the outer peripheries of the discs 1. The rollers 6b may be separately provided rotatably on the shaft 6a correspondingly to the discs 1, respectively. Alternatively, a single continuous roller may be used instead of the rollers 6b.

The disc revolution stopper 6 may include only roller shaft 6a.

The grooves 3c of the sleeve engage with the outer peripheries of the discs 1 and drive the discs 1 by the rotary shaft 3b when the brushes 4 are rotated. Therefore, rotation of the discs 1 becomes easier.

In particular, the grooves 6c of the disc revolution stopper 6 are formed in positions corresponding to the respective contact portions S. Thus, positions in which the discs rotate become constant and frictional forces between the discs 1 and the brushes 4 are provided stably. Therefore, the disc cleaning device 2 can rotate the discs while applying frictional forces thereto such that the discs are not scratched.

Instead of the sleeves having the grooves 3c, rotatable rings may be mounted on portions of the roller 3a corresponding to the positions of the discs 1 mounted in the contact portions S (refer to FIG. 2B). In such a case, the rings may be rotated by frictional contact with the outer peripheries of the discs 1 rotating by the brushes 4.

Incidentally, the grooves 3c in the form of valleys may be directly formed in the rotary shaft 3b correspondingly to the respective contact portions S.

Since there is no rotary shaft inserted into the center holes of the discs 1, an outer diameter of the brush 4 can be increased such that it reaches the center hole of the disc. As shown in FIG. 1B, the width of the brush 4 measured from the inner diameter to the outer diameter can be selected such that it reaches the center hole of the disc 1 and the disc can be partially held on the outside of the rotary shaft 3b. In such case, a substantial area of the disc can be cleaned.

Incidentally, a reference numeral 5 depicts the brush cleaner disc plate having a number of through-holes.

As shown in FIG. 1A, a lower portion of each of the five (5) discs 1 is held between adjacent brushes 4. Incidentally, although only 5 discs 1 are shown in FIG. 1A, each of (n) discs is arranged between adjacent brushes 4, where n=5.

A plurality (n) of brush cleaner disc plates 5 corresponding to the (n) discs (n=5 in FIG. 1A) clean the cylindrical brushes 4. An upper portion of each brush cleaner disc plate 5 is arranged between adjacent cylindrical brushes 4 below a center of the rotary shaft 3b. The brush cleaner discs 5 are supported on a shaft 5a in positions corresponding to positions of the n discs 1, as shown in FIG. 1B. The brush cleaner discs 5 are rotated with the rotation of the shaft 5a. The shaft 5a may be compulsorily rotated by a driving mechanism or opposite ends of the shaft 5a may be supported such that they can be freely rotated as in the case of the discs 1.

By inserting the brush cleaner disc 5 between adjacent cylindrical brushes 4, the brush cleaner disc 5 cleans the cylindrical brush 4 and provides guide grooves (gaps) for guiding the discs 1 into their insertion positions. Therefore, a number of discs 1 can easily be inserted to the insertion positions, simultaneously.

In FIG. 1A, each of the 6 cylindrical brushes 4 takes the form of a cylinder having length m for simplicity of explanation. However, the cylindrical brush 4 may take a circular disc plate by making the length m smaller as shown in FIGS. 2 to 4 since the number (n) of the brushes is much larger than 6, that is, n>=25. Therefore, the brush 4 becomes a circular disc plate brush and the length of the brush 4 is described as thickness of the brush 4 in the following description.

The brush 4 has a center hole, diameter of which is smaller than the diameter of the roller 3a (or the rotary shaft 3b thereof), and the roller 3a is pressure-inserted into the center holes of the (n+1) brushes 4. Further, the brushes 4 are integrated by collars respectively provided on opposite ends of the rotary shaft 3b so that the roller 3a and the (n+1) brushes 4 are fixed and integrated on the rotary shaft 3b. As a result, the brushes 4 rotate together with rotation of the rotary shaft 3b.

Incidentally, in the case where the rotary shaft 3b is pressure-inserted into the center holes of the brushes 4, the contact pressure thereof with respect to the discs 1 is not uniform if the positions of the brushes 4 on the rotary shaft 3b are not exact. Particularly, when the number (n) of the brushes 4 is large, the uneven contact pressure becomes a problem. Therefore, grooves extending along the rotary shaft 3b are formed inside of the center hole of the brush 4 and protrusions fitting in the grooves of the brush are formed on the side of the rotary shaft 3b, so that the brush 4 becomes movable axially along the rotary shaft 3b, as to be described later.

By using this construction, the brush 4 is rotated while movable in the axial direction of the rotary shaft 3b when the rotary shaft 3b is rotated. Therefore, axial positions of a number of brushes 4 are corrected so that contact pressure of the brushes to the discs can be made uniform.

In FIG. 1, a reference numeral 11 depicts a drive mechanism such as motors, etc., for rotating the rotary shaft 3b. When the rotary shaft 3b is rotated by the drive mechanism 11, the discs 1 each being held between adjacent cylindrical brushes 4 are rotated. A cleaning agent is jetted from a cleaning nozzle 28 (FIGS. 2 to 4) to the rotating discs 1. The discs 1 are rotated simultaneously while being showered with the cleaning agent from the cleaning nozzle 28 (FIGS. 2 to 4) without support of the rotary shaft and cleaned while being rubbed between the adjacent brushes 4. Simultaneously, the brush cleaning discs 5 are rotated to clean the brushes 4 with cleaning agent shower from a number of openings 5b thereof.

An overall cleaning operation for simultaneously cleaning the discs 1 will be described with reference to FIGS. 2 to 4. Incidentally, in FIG. 2B, only 5 brushes of the n ($n^3$ 25) brushes 4 are shown and the length m of the cylindrical brush is set smaller to make it the circular brush plate having thickness m.

In FIG. 2, a reference numeral 12 depicts a scrubbing chamber of the disc cleaning device 10 and a reference numeral 12a depicts a cleaning agent discharging holes.

A reference numeral 28a depicts a cleaning agent nozzle directed to the brush cleaner discs 5 and a reference numeral 9 depicts a roller loading mechanism for engaging the disc revolution stopper roller 6 with the outer peripheries of the discs 1.

The roller loading mechanism 9 is constituted with the disc revolution stopper roller 6, a rotary arm 9a on which the rotary shaft 6a is planted, a rotary shaft 9b for rotating the rotary arm 9a and a rotary actuator (not shown). The rotary arm 9a is provided on each of the opposite ends of the rotary shaft 6a and the rotary arms 9a support the rotary shaft 6a at the opposite ends thereof.

As shown in FIG. 2, the rotary shaft 9b is rotated counterclockwise by a predetermined angle in the initial state to define the rotary arms 9a of the roller loading mechanism 9 in a roller waiting position. In the roller waiting position of the rotary arm 9a, the disc revolution stopper 6 is moved to a position out of a region to which the discs 1 are lowered by a disc delivering hand 13.

Figure 4A:
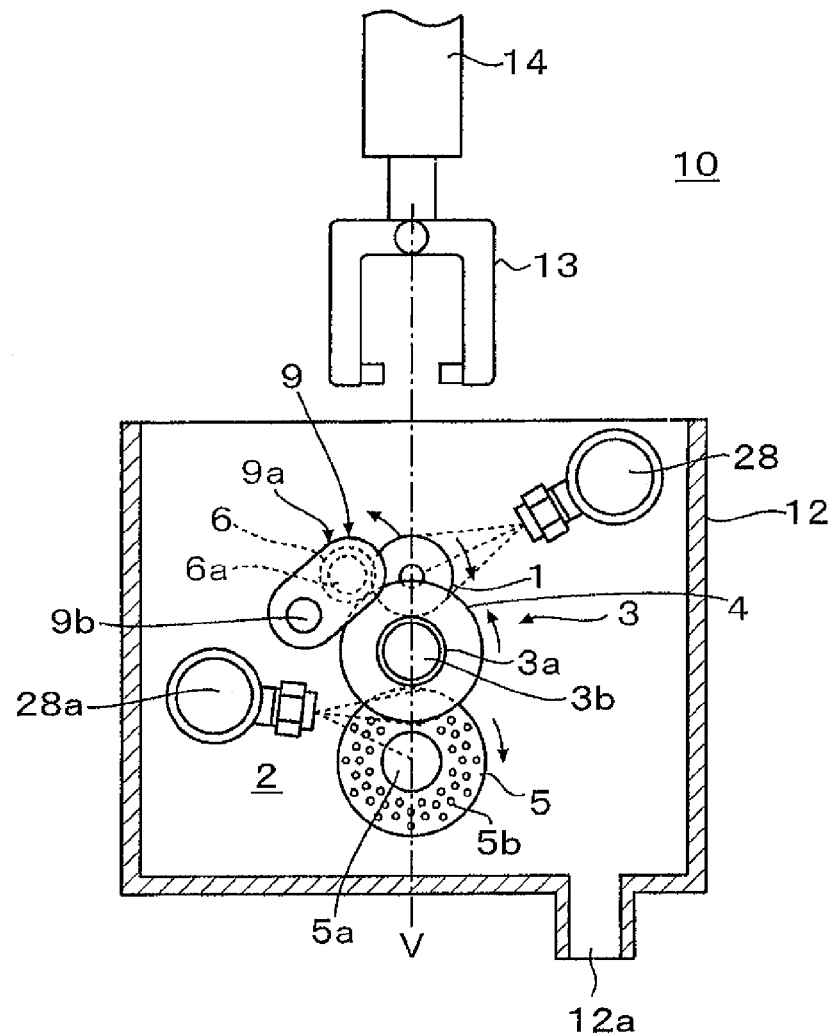
FIG. 4A is a cross section of the inner construction of the disc cleaning device for explaining a chucking of disc.

When the rotary shaft 6a is rotated clockwise by rotating the rotary arm 9a about the rotary shaft 9b from the roller waiting position by the rotary actuator of the roller loading mechanism 9, the disc revolution stopper 6 is moved up to a position shown in FIG. 4A, so that the rotary arms 9a are positioned in a roller loading position.

The disc delivering hand 13 is moved vertically by an elevator 14. The disc delivering hand 13 has a pair of bars for chucking the n discs 1 at opposite two points of the outer peripheries of the discs 1. The bars have n nails of chucking nails arranged at intervals of m, which is the thickness of the brush disc 4.

Figure 2A:
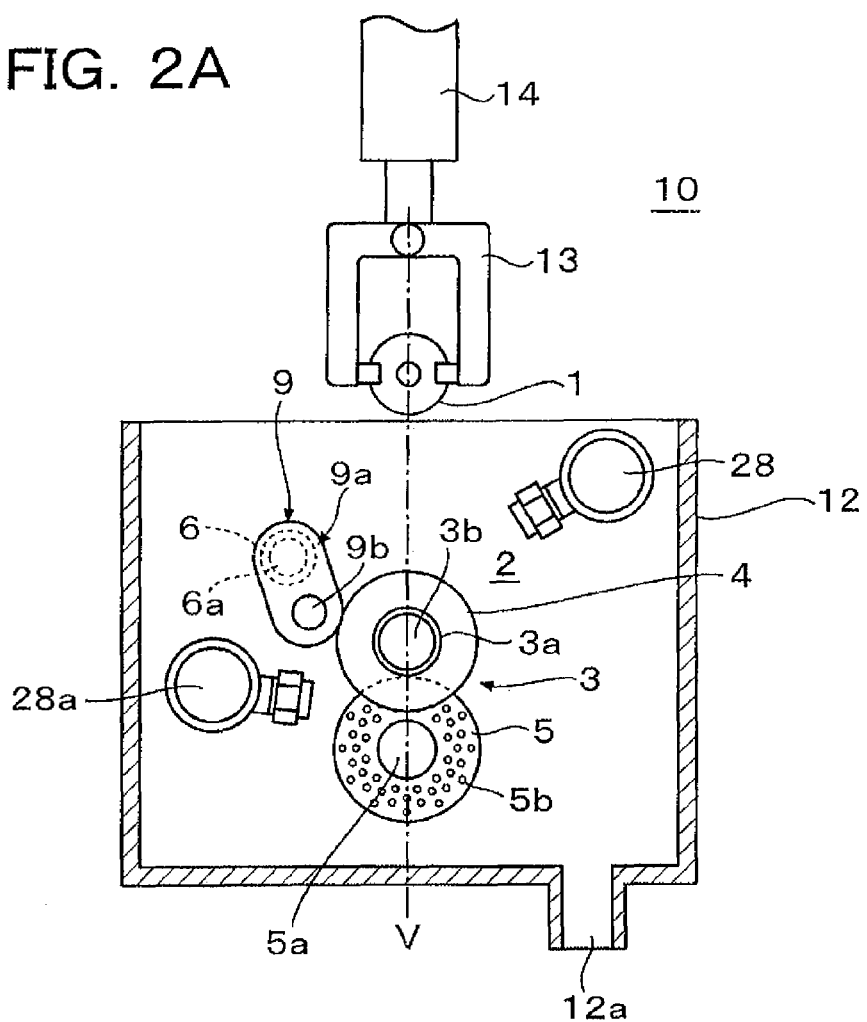
FIG. 2A is a cross section of an internal construction of the disc cleaning device for explaining a loading of discs to the cleaning device.
Figure 2B:
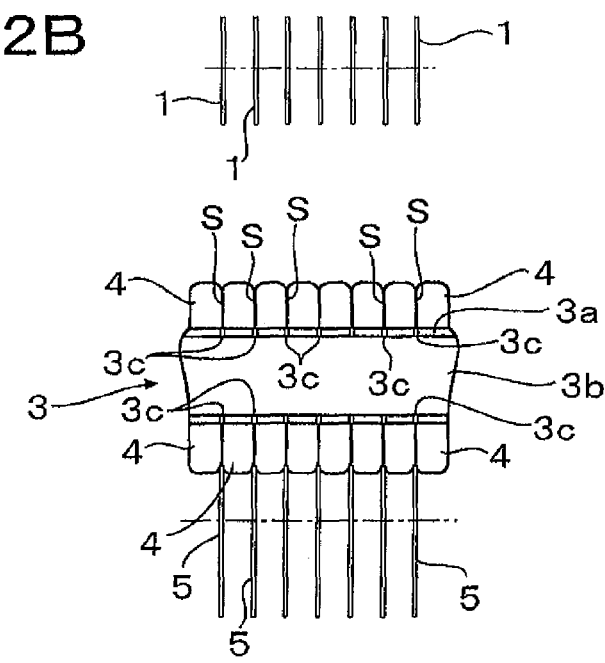
FIG. 2B is a side view of a main portion of the internal construction shown in FIG. 2A.

In FIGS. 2A and 2B, the n discs 1 are side-chucked by the disc delivering hand 13 in the loading position (FIG. 2A). The centers of the side-chucked discs 1 in this state are positioned above the cleaning mechanism 2 on substantially a vertical line V passing through the rotation center of the rotary shaft 3b. Therefore, the discs 1 are positioned above the n contact positions S of the (n+1) brushes 4 (FIG. 2B). The rotary arms 9a of the roller loading mechanism 9 are in the roller waiting position.

Figure 3A:
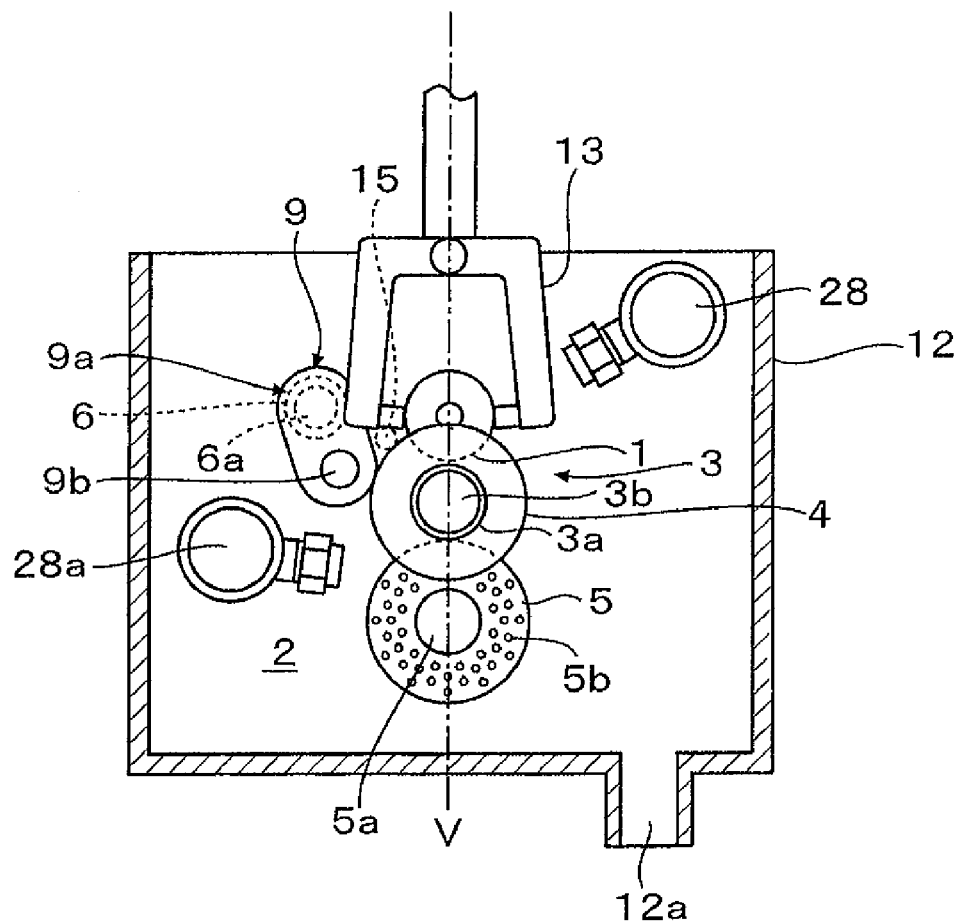
FIG. 3A is a cross section of an inner construction of the disc cleaning device for explaining a disc insertion.
Figure 3B:
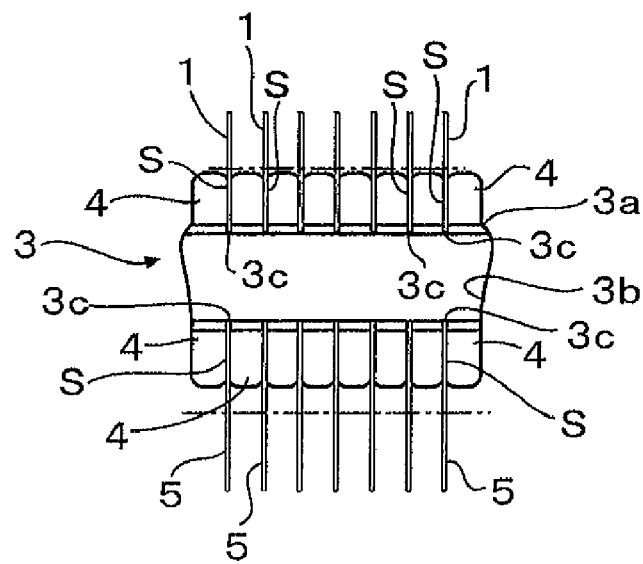
FIG. 3B is a side view of a main portion of the internal construction of the disc cleaning device shown in FIG. 3A.

Then, the disc delivering hand 13 is lowered to the position shown in FIG. 3A by the elevator 14 and inserts the n discs 1 into the n contact positions S. Therefore, the n discs 1 are held by the roller 3a through the n contact positions S as shown in FIG. 3B. Incidentally, FIGS. 3A and 3B correspond to FIGS. 2A and 2B, respectively.

Figure 4B:
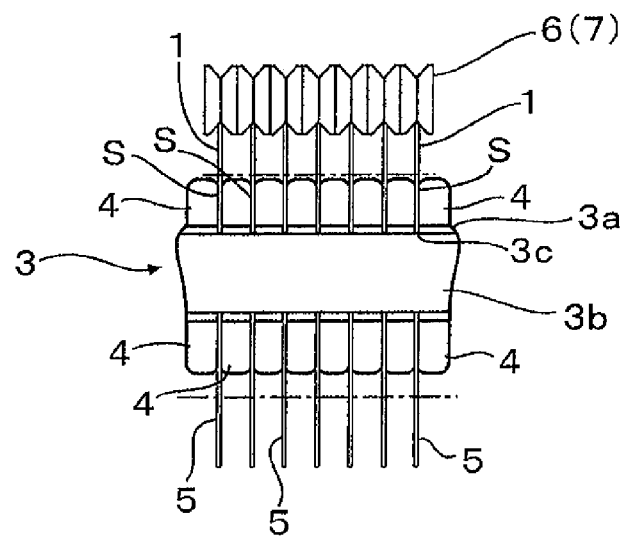
FIG. 4B is a side view of a main portion of the internal construction of the disc cleaning device shown in FIG. 4A.

Then, the disc delivering hand 13 releases the side-chucks of the n discs 1 simultaneously and then is elevated. The disc revolution stopper 6 is in contact with the outer peripheries of the n discs 1, so that the n discs 1 become rotatable (FIGS. 4A and 4B). Incidentally, although FIGS. 4A and 4B correspond to FIGS. 2a and 2B, respectively, FIG. 4B is a side view thereof when looked from the side of the disc revolution stopper 6.

The n discs 1 start to rotate when the rotary shaft 3b rotates in a direction shown by an arrow in FIG. 4A. Simultaneously therewith, liquid cleaner is jetted from the cleaning nozzles 28 and 28a, so that the discs 1 and the brush cleaner discs 5 are cleaned with rotation of the rotary shaft 3b. Thereafter, rinse liquid is jetted from the cleaning agent nozzles 28 and 28a to rinse the discs and the brush cleaning discs on demand. Thus, filth on the discs 1 is removed.

When the cleaning of the discs 1 is completed, the rotary arms 9a of the roller loading mechanism 9 are rotated counterclockwise from the state shown in FIG. 4A to the roller waiting position. The disc revolution stopper roller 6 becomes the state shown in FIG. 3A. In this position, the disc delivering hand 13 is lowered and the discs 1 side-chucked simultaneously by the disc delivering hand 13 are moved upward to the state shown in FIG. 2A. The discs 1 thus cleaned are positioned in an unload position.

Incidentally, the unloaded discs 1 are transported to a drying step.

In this embodiment, the disc revolution stopper 6 is moved between the roller waiting position (FIG. 3A) and the roller loading position (FIG. 4A) by the rotary arms 9a of the roller loading mechanism 9. However, when the disc revolution stopper 6 is arranged in a position in which the disc revolution stopper 6 does not obstruct the disc delivering hand 13, the disc revolution stopper 6 can be provided in a fixed position.

That is, instead of the disc revolution stopper 6, a disc revolution stopper 15 (see the dotted circular portion in FIG. 3A) in the form of a single shaft is provided as a fixed stopper in a position in the vicinity of the outer periphery of the cylindrical brush 4 and above the center of the disc 1 and lower than the chuck of the disc delivering hand 13, as shown in FIG. 3A. Thus, it is possible to remove the roller loading mechanism 9. The disc revolution stopper 15 may be not the shaft but a roller having a small diameter.

When the brushes 4 rotate counterclockwise with rotation of the rotary shaft 3b, the n discs 1 rotate counterclockwise up to the position of the disc revolution stopper 15. In this position, the disc revolution stopper 15 comes in contact with the outer peripheries of the discs 1 to prevent the revolution of the discs 1 and the discs start to rotate.

When the discs 1 are to be picked up by the disc delivering hand 13, the roller 3a is rotated clockwise to rotate the discs 1 such that the centers of the discs 1 held by the brushes 4 become on the vertical line V.

Embodiment 2

FIG. 5 shows another embodiment of the present invention in which the disc is chucked at three points of the outer periphery thereof.

Figure 5A:
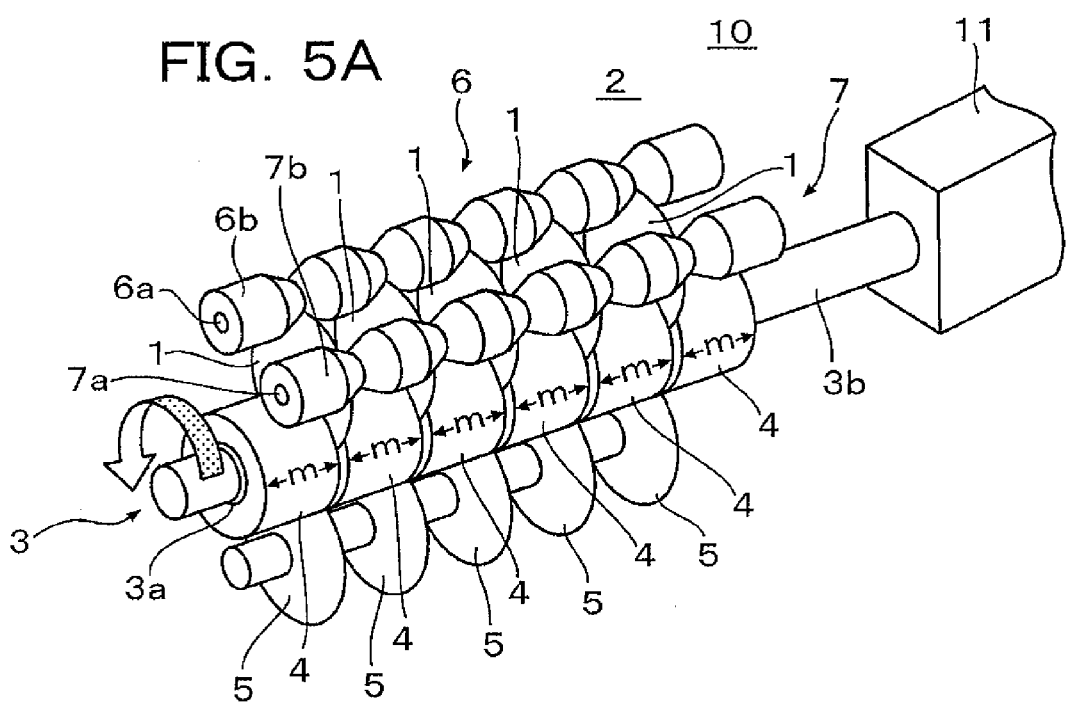
FIG. 5A is a perspective view of a cleaning portion according to another embodiment of the present invention in which discs are rotated by chucking outer peripherals of the discs at three points by three axes.

As shown in FIG. 5A, this embodiment is featured by that the roller loading mechanism 9 is provided as a 3-point chucking mechanism.

That is, in the roller loading mechanism 9, the roller 3a is used as one of three chucking shafts and the disc revolution stopper 6 is used as one of the remaining two chucking shafts. Further, as shown in FIG. 5A, the last chucking shaft is a guide roller 7 having a structure similar to that of the disc revolution stopper 6. Incidentally, a reference numeral 7a is a rotary shaft of the guide roller 7.

Figure 5B:
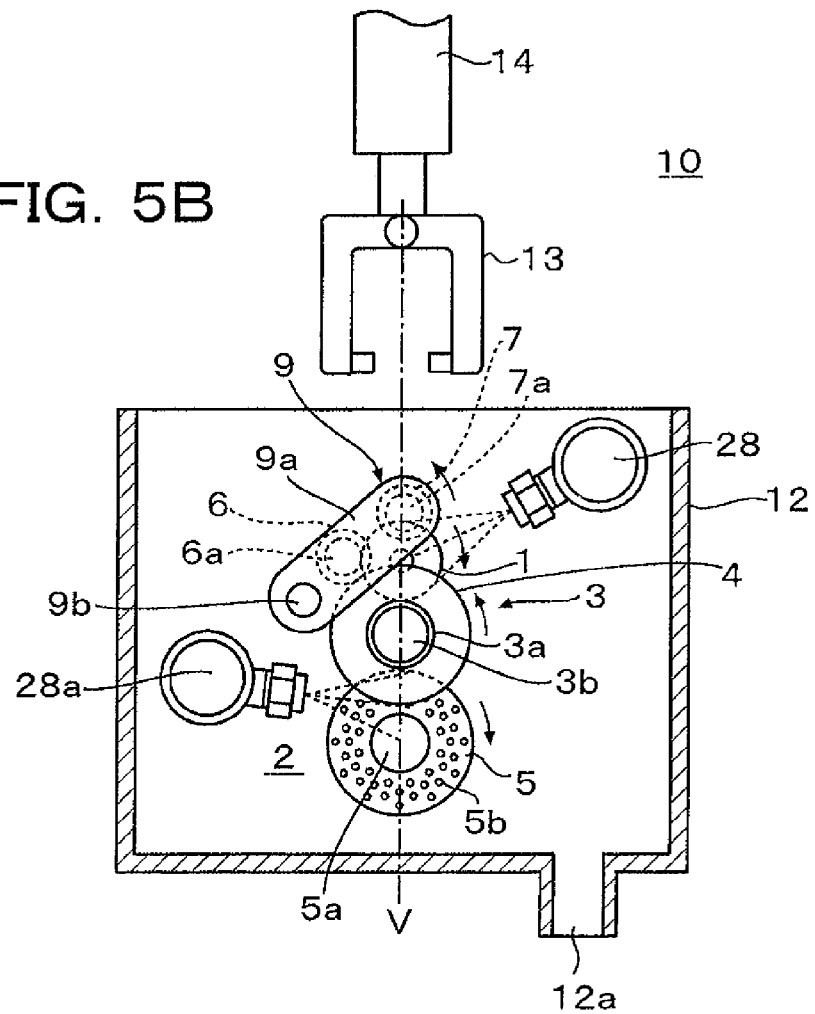
FIG. 5B is a vertical cross section of the construction shown in FIG. 5A.

The guide roller 7 is arranged on an opposite side to the disc revolution stopper 6 about the vertical line V, as shown in FIG. 5B. The roller 7 has no revolution stopping function as that of the disc revolution stopper 6 and only guides the rotation of the discs. In order to explain the principle of 3-point chucking, the position of the guide roller 7 is symmetrical to the disc revolution stopper 6 about the vertical line V in FIG. 5A.

As a practical matter, in order to preliminarily move the guide roller 7 from the passage of the disc delivering hand 13 to the waiting position or to preliminarily engage the guide roller 7 with the outer peripheries of the discs from the waiting position, the guide roller 7 may be positioned close to the vertical line V as shown in FIG. 5B.

As shown in FIG. 5B, the rotary arms 9a of the roller loading mechanism 9 support the opposite ends of the rotary shaft 6a of the disc revolution stopper 6 and the opposite ends of the shaft 7a of the guide roller 7, which is in parallel to the rotary shaft 6a with a predetermined gap between them, in parallel to the rotary shaft 6a. The guide roller 7 has a roller 7b corresponding to the roller 6b.

As described with reference to FIG. 2A, in the initial state of the roller loading mechanism 9, the rotary shaft 9b is rotated counterclockwise by a predetermined angle and the rotary arms 9a are in the roller waiting position similarly to the case shown in FIG. 3A. In this state, the disc revolution stopper (guide roller) 6 and the guide roller 7 are positioned out of the area onto which the n discs 1 are lowered by the disc delivering hand 13.

In this embodiment, as described with reference to FIG. 4A, in the roller loading position, the roller loading mechanism 9 rotates the rotary arm 9a clockwise to make the rollers 6b and 7b contact the outer peripheries of the discs 1 to thereby chuck the discs 1 such that the discs 1 can rotate (FIG. 5B).

As shown in FIG. 5B, since the shaft 6a of the guide roller 6 and the shaft 7a of the guide roller 7 are positioned oppositely with respect to the vertical line V and the center of the rotary shaft 3b is on the vertical line V, the discs are rotatably chucked at the 3 points by these shafts.

As a result, the discs stably rotate with the rotation of the brushes 4. Since, in this embodiment, each disc is chucked at 3 points, this embodiment can be applied to not only discs smaller than the 2.5 inch disc but also to discs larger than the 2.5 inch disc.

Embodiment 3

Figure 6:
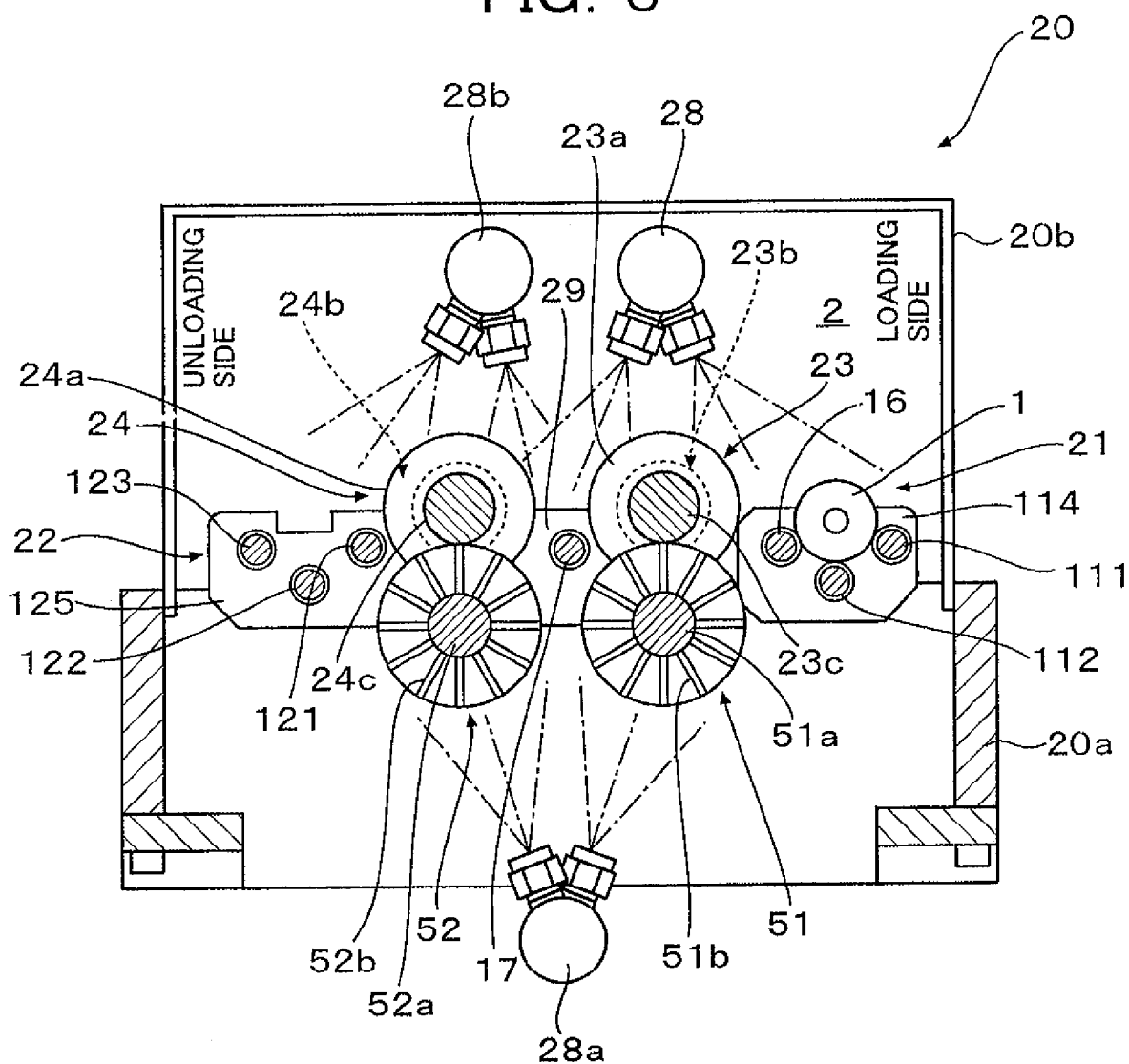
FIG. 6 is a side cross section of a disc cleaning device according to another embodiment of the present invention.

FIG. 6 is a side cross section of a disc cleaning device according to another embodiment of the present invention.

In FIG. 6, a reference numeral 20 depicts a disc cleaning device, 20a a base casing and 20b an upper cover.

A reference numeral 1 depicts discs to be cleaned, 21 a disc loading mechanism and 22 a disc receiving mechanism. Reference numerals 23 and 24 depict rotary brush units and reference numerals 51 and 52 depict brush cleaner discs.

The disc loading mechanism 21 is provided on the load side adjacently to the rotary brush unit 23. The disc loading mechanism 21 inserts a plurality of discs 1 to the rotary brush unit 23 while the brushes are kept rotating.

The disc loading mechanism 22 is provided on the unload side adjacently to the rotary brush unit 24. The disc loading mechanism 22 receives a plurality of cleaned discs 1 from the rotary brush unit 24 and ejects them externally of the device. This disc receiving mechanism can receive the discs 1 from the rotary brush unit 24 while the brushes are kept rotating. Therefore, it is possible to further improve the throughput of the cleaning device.

A plurality (n) of the brush cleaner discs 51 have radial openings 51b and are mounted on a shaft 51a provided correspondingly to the n discs 1. The brush cleaner discs are rotated simultaneously on the shaft 51a by frictional contact with the rotating rotary brush 23a of the rotary brush unit 23. Similarly, the brush cleaner discs 52 have radial openings 52b and a plurality (n) of brush cleaner discs 52 are mounted on a shaft 52a provided correspondingly to the n discs 1. The brush cleaner discs 52 are rotated simultaneously on the shaft 52a by frictional contact with the rotating rotary brush 24a of the rotary brush unit 24. Incidentally, in this case, the brush cleaner discs 51 and 52 may be driven by independent motors, respectively.

Figure 7:
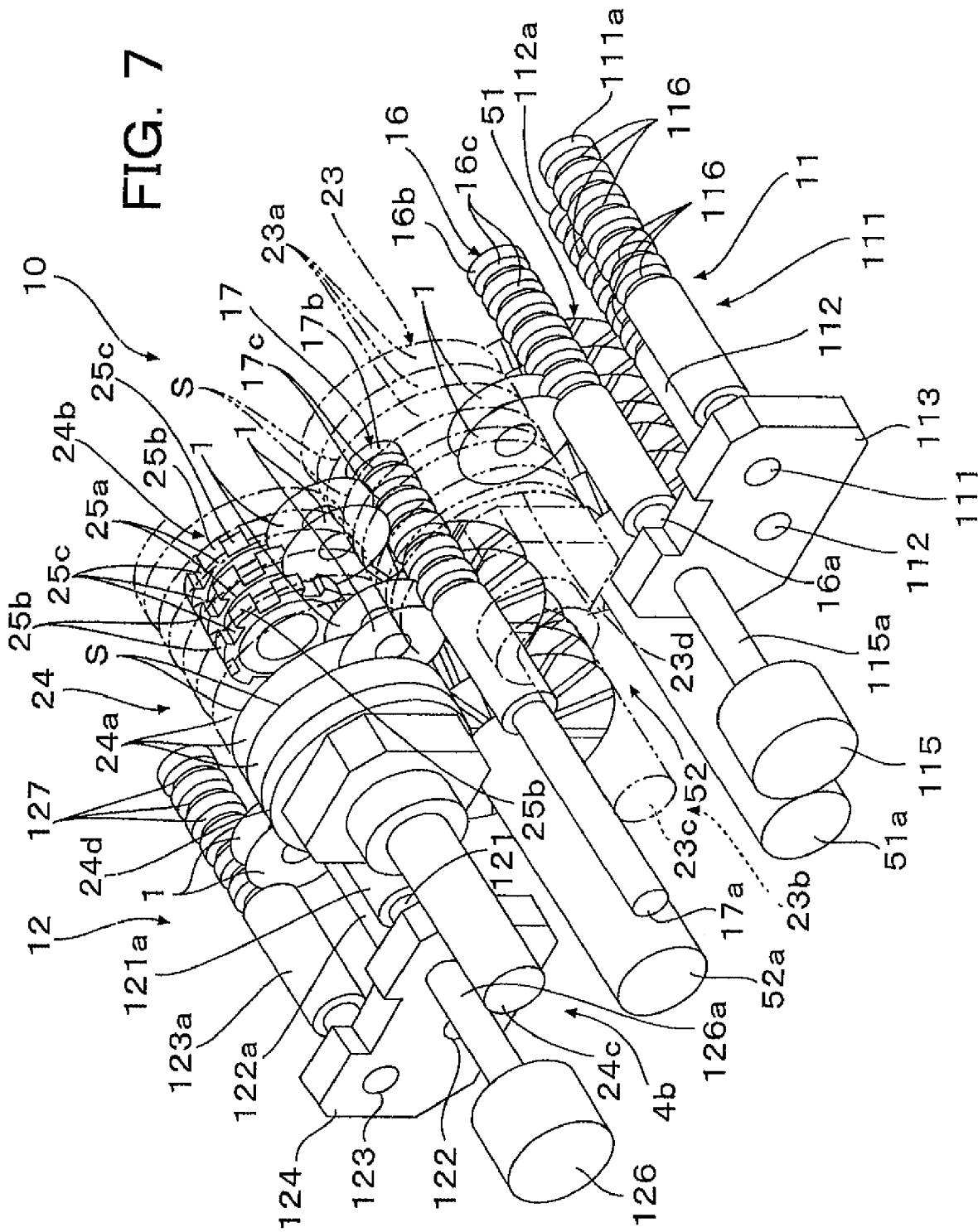
FIG. 7 is a perspective view of the disc cleaning device shown in FIG. 6.
Figure 8A:
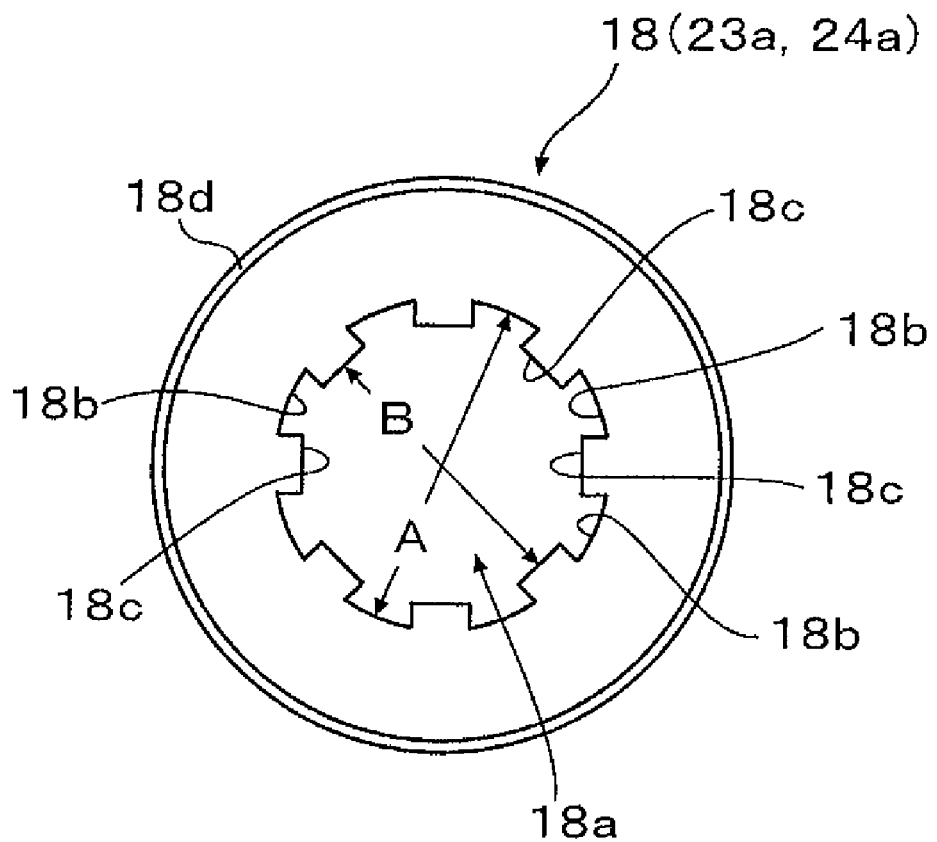
FIG. 8A shows a circular brush plate of the embodiment shown in FIG. 6.

The rotary brush unit 23 is constructed with a plurality of PVA disc brushes 23a, a plurality of core rollers 23b (FIGS. 7 and 8A) on which the respective disc brushes 23a are mounted and a rotary shaft 23c on which the PVA disc brushes 23a and the core rollers 23c are mounted. Similarly, the rotary brush unit 24 is constructed with a plurality of PVA disc brushes 24a, a plurality of core rollers 24b (FIGS. 7 and 8A) on which the respective disc brushes 24a are mounted and a rotary shaft 24c on which the PVA disc brushes 24a and the core rollers 24c are mounted (FIGS. 7 and 8A). The disc brushes 23a and 24a correspond to the cylindrical brushes 4, respectively.

Cleaning nozzles 28 and 28b are arranged above the rotary brush units 23 and 24 within the upper cover 20b as the disc cleaning nozzles. A cleaning nozzle 28a, which is arranged below the brush cleaner discs 51 and 52 within the base casing 20a, cleans the brush cleaner discs 51 and 52.

As mentioned above, the discs 1 are inserted into and held by the respective contact portions S between the brushing faces of adjacent disc brushes 23a and 24a. The width measured from the inner to outer diameter of the disc brush 23a (24a) is equal to the radius of the disc 1.

In FIG. 7 showing an internal structure of the disc cleaning device 10, the rotary brush unit 23 is shown by chain lines and a portion of the rotary brush unit 24 is shown by solid lines, with a portion of the disc brush 24a being omitted such that the core roller 24b can be seen. The core roller 23b is omitted and only a portion of the brush cleaner disc 51 on the side of the rotary brush unit 23 is shown. The rotary shaft 51a thereof is shown.

In FIGS. 6 and 7, the rotary brush unit 23 is arranged on the side of the disc loader and the rotary brush unit 24 is arranged on the side of the disc unloader. Reference numerals 23c and 24c depict rotary shafts of the rotary brush units 23 and 24, respectively, 25a circular grooves provided between the core rollers 23b and 24b, 16c and 17c circular grooves provided in the disc revolution stoppers 16 and 17, respectively, 25b protrusions provided in the respective core rollers 23b and 24b (FIG. 7), 16a and 17a shafts of the respective disc revolution stoppers 16 and 17, 16b and 17b core rollers having circular grooves for the disc revolution stoppers 16 and 17 and 51a and 52a rotary shafts of the respective cleaner discs 51 and 52.

Incidentally, although the disc revolution stopper 15 shown in FIG. 3A is positioned above the center of the disc 1, the disc revolution stoppers 16 and 17 in this embodiment are positioned at the lower right side of the discs 1 to be cleaned as shown in FIGS. 6 and 7. Opposite ends of the disc revolution stopper 17 are supported by bearings between a front side frame (not shown) and a rear frame 29 shown in FIG. 6.

The core rollers 23b and 24b are arranged adjacently on the rotary shafts 23c and 24c, respectively. The circular grooves 25a are formed between the core rollers 23b and 24b correspondingly to the contact portions S. The circular grooves 16c and 17c of the disc revolution stoppers 16 and 17 are also provided correspondingly to the contact portions S.

Configurations of the disc brushes 23a and 24a and a configuration of the core rollers 23b and 24b forming the circular grooves 25a are shown in FIG. 8.

In FIG. 8A, the disc brush 23a (24a) is a porous PVA sponge disc member (sponge disc member) 18 having a center opening 18a. Eight (8) grooves 18b are formed at regular intervals in an inner periphery of the center opening 18a of the sponge disc member 18 and eight (8) protrusions 18c are formed between adjacent grooves 18b.

The sponge disc 18 has chamfers 18d to facilitate the insertion of the discs 1 to the contact portions S between the disc brushes 23a (24a) (FIG. 7). Thickness of the disc brushes 23a (24a) in the axial direction and diameter thereof are 15 to 20 mm and 40 to 50 mm in a case of, for example, the 1.8 inch disc, respectively.

Figure 8B:
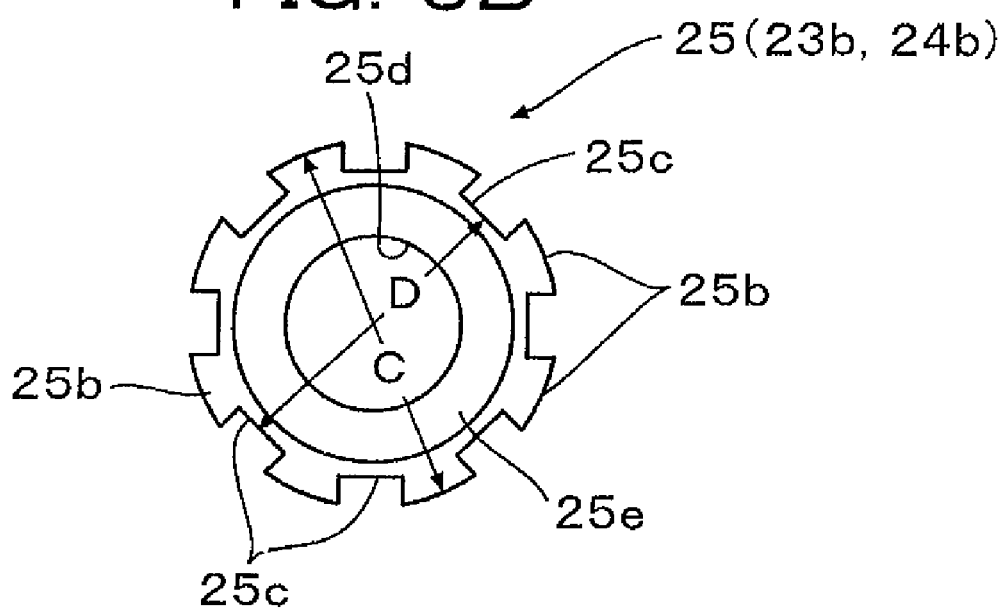
FIG. 8B shows a center roller of the embodiment shown in FIG. 6.

On the other hand, the core roller 23b (24b) is constructed with a ring member 25 fitted in the disc brush 23a (24a). As shown in FIG. 8B, in an outer peripheral surface of the ring member 25, eight (8) protrusions 25b to be fitted in the respective 8 grooves 18b of the disc brush and grooves 25c are formed between the protrusions 25b. The protrusions 18a of the sponge disc 18 are fitted in the grooves 25c, respectively.

A flange 25e is formed around the center opening 25d of the ring member 25. An axial thickness of the protrusions 25b and the grooves 25c is smaller than an axial thickness of the grooves 18b and the protrusions 18c.

The sponge disc 18 mounted on the outer periphery of the ring member 25 through the center opening 18a becomes the disc brush 23a (24a). Therefore, the disc brush 23a (24a) is axially movable with respect to the core roller 23b (24b) by a predetermined axial force. In other words, these members constitute an axial spline joint.

As shown in FIG. 8A, depth of the groove 18b is 3 mm to 6 mm and diameter A of the sponge disc 18 (disc brushes 23a (24a)) measured between bottoms of the opposing grooves 18b is smaller than outer diameter C of the core roller 23b (24b) measured between opposing protrusions 25b by about 10% and, similarly, diameter B of the sponge disc 18 (disc brushes 23a (24a)) measured between protrusions of the opposing grooves 18c is smaller than diameter D of the core roller 23b (24b) measured between the opposing bottoms 25c by about 10%. Height of the protrusion 25b is 2 mm to 5 mm.

Therefore, the sponge disc 18 (disc brushes 23a (24a)) can be moved axially of the ring member 25 (core roller 23b (24b)) when a certain force or more is applied to the sponge disc 18. Further, it is possible to sufficiently hold the disc brushes 23a (24a) in the rotating direction.

Incidentally, it is preferable that diameter A is in a range smaller than diameter C by 8 to 15% and diameter B is smaller than diameter D by 8 to 15%.

As a result, it is possible to hold the disc brushes 23a (24a) in the rotating direction and the sponge disc 18 (disc brushes 23a (24a)) becomes movable axially of the ring member 25 (core roller 23b (24b)) when a certain force is applied to the sponge disc 18.

Diameter of the center opening 25d of the ring member (core roller 23b (24b)) is selected such that the ring member can be fitted on the rotary shaft 23c (24c). When a number of the core rollers 23b (24b) are fitted on the rotary shaft 23c (24c) and contact the flange portions 25e of the ring members 25 shown in FIG. 7, the circular grooves 25a are formed. Further, the core rollers 23b (24b) fitted on the rotary shaft 23c (24c) are fixed to the shaft when the core rollers are pressure-contacted by means of a collar 23d (24d) provided in an end portion of the rotary shaft 23c (24c) and a similar collar (not shown) provided in the other end portion.

Incidentally, the collar 23d (24d) and the other collar, which are screwed to the rotary shaft 23c (24c), are moved to and fro along the rotary shaft when the shaft is rotated and the core rollers 23b (24b) can be fixed to the rotary shaft 23c (24c) by tightening the core rollers between the rotary collars. As a result, the rotary brush unit 23 (24) together with the rotary shaft 23c (24c) and the core rollers 23b (24b) constitutes a single continuous roller.

Incidentally, a drive motor (not shown) is coupled to the rotary shaft 23c (24c).

On the other hand, as shown in FIG. 6A, the disc revolution stopper 16 is on the side of the rotary brush unit 23. That is, the disc revolution stopper is provided in a position adjacent to the outer periphery of the disc brush 23a on the disc loading side (right side in FIG. 6). The disc revolution stopper 17 is adjacent to the rotary brush unit 23 on the side of the rotary brush unit 24 and provided between the rotary brush units 23 and 24. The position thereof is the lowest point of the outer periphery of the disc 1 or close to the outer periphery of the disc brush 23a of the rotary brush unit 23 in the vicinity of the lowest point such that it engages with the outer periphery of the disc 1. The reason for this will be described later.

The shaft 16a (17a) of the disc revolution stopper 16 (17) is provided in parallel to the rotary shaft 23c (24c). A sleeve 16b (17b) having circular grooves 16c (17c) is provided on the shaft 16a (17a) such that the circular grooves 16c (17c) are positioned correspondingly to the discs 1. The rotary shafts 16a and 17a are provided on both sides of the rotary shaft 23c in FIG. 6 and the opposite ends thereof are supported by bearings provided in the frames. In FIG. 6, only one (29) of the frames is shown.

These disc revolution stoppers 16 and 17 form long rollers extending along the axial direction and the circular grooves 16c and 17c are in contact with the outer peripheries of the discs 1 mounted in the contact portions S (FIG. 7).

Incidentally, it may be possible to provide rotatable rollers on the shaft 16a (17a) in portions of the disc revolution stopper 16 (17) corresponding to positions of the discs 1 inserted to the contact portions S (FIG. 7). It may be possible to provide circular grooves 16c (17c) on the rotatable rollers. Further, the disc revolution stopper 16 (17) may be not a roller but a mere shaft.

When the disc brushes 23a and 23b rotate clockwise by clockwise rotation of the rotary shaft 23c and the rotary shaft 24c rotate clockwise as shown in FIGS. 9C and 9D, the discs 1 rotate counterclockwise by frictional engagement with the disc brushes 23a and 24a. In this case, the circular grooves 25a, 16c and 17c support the rotating discs 1 stably.

Incidentally, it may be possible to directly provide grooves 25a on the rotary shafts 23c and 24c corresponding to the contact portions S without using the sleeves.

Instead of the grooves 25a, rollers which are rotatable with respect to the rotary shafts 23c and 24c may be provided independently on only portions of the core rollers 23b and 24b corresponding to the positions of the discs 1 inserted into the contact portions S (FIG. 7). By clockwise rotation of these independent rollers, friction between these independent rollers and the rotary shafts 23c and 24c is reduced, so that the counterclockwise rotation of the discs becomes easier. It is, of course, possible to further provide circumferential grooves 25a in the independent rollers.

The disc loading mechanism 21 receives vertically standing discs loaded externally from the disc delivering hand 19a shown in FIG. 9A. A plurality (n) of loaded discs are standing along a cross sectional direction of said rotary brushes. The discs are rotated about a point of the outer peripheries of the discs (the axis of the disc revolution stopper 16) toward the disc brush 23a and inserted into between the disc brushes 23a.

As shown in FIGS. 7 and 9B, about one fourth of the outer periphery of each of the n discs 1 is inserted into and held in between adjacent rotating disc brushes 23a (24a) on the side above the centers of the rotary shaft 23a (24a), where n is an integer equal to or larger than 2. About one fourth of the n brush cleaner discs 51 (52) is inserted into and held in between adjacent rotating disc brushes 23a (24a) on the side below the centers of the rotary shaft 23a (24a). As described previously, the formation of guiding grooves (gaps) in the inserting positions of the discs 1 become easier, so that the simultaneous insertion of the discs 1 becomes easier.

When the disc brushes 23a (24a) are forcibly inserted into the rotary shaft 23c (24c), there is a problem that the contact pressure to the respective discs 1 does not becomes uniform since insertion positions are not defined exactly. In this embodiment, however, the grooves 18b of the sponge disc 18 extending axially of the rotary shaft 23c (24c), which receive the axial protrusions 25b provided in the core rollers 23b (24b), are provided in the center opening of the disc brushes 23a (24a). Therefore, it becomes possible to move the disc brushes 23a (24a) axially of the rotary shaft 23c (24c) while rotating the disc brushes 23a (24a).

In addition to this, a portion of the brush cleaner disc 51 (52) is inserted up to the disc brushes 23a (24a) and, therefore, the positions of the disc brushes 23a (24a) are shifted to appropriate positions in axial direction. As a result, the positions of the disc brushes 23a (24a) are set to appropriate positions on the rotary shaft 23c (24c).

As a result, the contact pressure between the discs 1 inserted to the contact portions S and the disc brushes 23a (24a) is maintained uniform. Therefore, it is possible to contact the brushing faces of the disc brushes 23a (24a) with the surfaces of the discs 1 with appropriate contact pressure, so that the effect of removing texture on the discs 1 or preventing contact scratches on the discs 1 is obtained.

The (n+1) disc brushes 23a (24a) may be forcibly inserted on to the core rollers 23b (24b) continuously through the center holes thereof. Since the disc brushes 23a (24a) are inserted and fixed such that they can not move axially with respect to the rotary shaft 23c (24c), the core rollers 23b (24b) and the disc brushes 23a (24a) can be easily integrated.

The disc inserting mechanism 21 shown in FIG. 6 includes the disc revolution stopper 16 and shafts 111 and 112 (referred to as "disc receiving shaft", hereinafter) for receiving the discs. These three shafts constitute a disc receiving tray or a disc receiving space for receiving the discs in standing state.

As shown in FIGS. 6 and 7, the disc inserting mechanism 21 further includes brackets 113 (FIG. 7) and 114 (FIG. 6), which have opposite ends fixed to the disc revolution stopper 16 and support opposite ends of the disc receiving shafts 111 and 112, and a stepping motor 115 coupled to the bracket 114 in the shaft position of the disc revolution stopper 16.

A rotary shaft 115a of the stepping motor 115 is coupled to the bracket 114 to rotate the latter. Opposite end portions of the shaft 16a of the disc revolution stopper 16 and the disc receiving shafts 111 and 112 are supported by bearings of the brackets 113 and 114 such that the shaft 16a and the disc receiving shafts 111 and 112 can rotate freely. Therefore, it is possible to insert the discs 1 into the contact portions of the disc brushes 23a while rotating the discs 1 correspondingly to rotation of the disc brushes 23a.

Incidentally, the stepping motor 115 may be of the rotary air cylinder type.

Sleeves 111a and 112a are adhered closely to the disc receiving shafts 111 and 112. The sleeves 111a and 112a have circular grooves 116 corresponding to the respective discs 1 such that the outer peripheries of the discs 1 are in contact with the grooves, respectively. Positions of the circular grooves 116 correspond to the circular grooves 16c of the disc revolution stopper 16 as well as to the circular grooves 25a.

The sleeves 111a and 112a having the grooves are bearing-supported such that they can rotate about the disc receiving shafts 111 and 112. The sleeves may be inserted on the disc receiving shafts 111 and 112 with small gaps.

On the other hand, the disc delivering hand 19a shown in FIG. 9A is vertically moved by an elevator mechanism (not shown) and chucks the n discs 1 at opposite two points of the peripheries of the discs. That is, the disc delivering hand 19a has n chucks at equal intervals of the thickness of the disc brush.

As shown in FIG. 6, the disc revolution stopper 16 and the disc receiving shaft 111 are arranged in parallel with a gap smaller than the diameter of the disc 1 in horizontal direction in a level slightly lower than the center of the discs 1 supported thereby. The disc receiving shaft 112 is arranged between the disc revolution stopper 16 and the disc receiving shaft 111 in a position lower than the disc revolution stopper and the receiving shaft to support the lowest point of the outer peripheries of the discs 1. Therefore, the disc revolution stopper and two receiving shafts, which are positioned below the discs, form the disc receiving tray (FIG. 6) and receives n discs 1 from the disc delivering hand 19a (FIG. 9A) simultaneously. As a result, the discs 1 are supported thereby with more than half of the outer peripheral areas of the discs being exposed.

When the disc revolution stopper 16 is rotated counterclockwise by about 90° by the stepping motor 115, the bracket 113 and a bracket 114 (not shown) are rotated counterclockwise by 90° or more. Therefore, the disc receiving shafts 111 and 112 of the disc loading mechanism 21 are rotated counterclockwise by about 90° (FIG. 9B).

As a result, the n discs 1 held by the disc loading mechanism 21 are inserted simultaneously to the rotary brush unit 23, which is rotating. Thereafter, by rotating the bracket 114 clockwise by the stepping motor 115, the brackets 113 and 114 (not shown) is rotated clockwise by about 90°, so that the disc receiving shafts 111 and 112 of the disc loading mechanism 21 are rotated clockwise and returned to a horizontal position, which is the loading position (FIG. 9B).

The disc receiving mechanism 22 shown in FIG. 6 receives the cleaned discs 1 in the standing state from the rotary brush unit 24, and rotates about a point outside the discs 1 to transport the discs 1 to the unloading position. Then, the cleaned discs 1 are transferred to the disc delivering hand 19b arranged in the unloading position shown in FIG. 11C.

As shown in FIGS. 6 and 7, the disc receiving mechanism 22 is provided in parallel to the rotary shaft 24c and adjacent to the rotary unit 24 on the unloading side. The disc receiving mechanism 22 includes disc receiving shafts 121, 122 and 123. The disc receiving shafts 122 and 123 correspond to the disc receiving shafts 111 and 112 of the disc loading mechanism 21, respectively. A rotary shaft 126a of a stepping motor 126 is coupled to a bracket 124 (FIG. 7) to rotate the bracket 124. Opposite end portions of the disc receiving shafts 121, 122 and 123 are bearing-supported by brackets 124 and 125 (FIG. 6) and can freely rotate.

Incidentally, the stepping motor 126 may be of the rotary air cylinder type. The stepping motors 126 and 115 are fixed to a device frame (not shown in FIG. 7).

Grooved sleeves 121a, 122a and 123a are provided on the disc receiving shafts 121, 122 and 123, respectively. The brackets 124 (FIG. 7) and 125 (FIG. 6) correspond to the brackets 113 and 114 of the disc loading mechanism 21, respectively, and the stepping motor 126 corresponds to the stepping motor 115. Circular grooves 127 correspond to the circular grooves 116 formed in the sleeves of the disc loading mechanism 21.

However, since the disc receiving shaft 121 works as a shaft for preventing revolution of the discs and ejecting the discs, rotation angle of the disc receiving mechanism 22 is about a half of rotation angle of the disc loading mechanism 21.

Figure 11A:
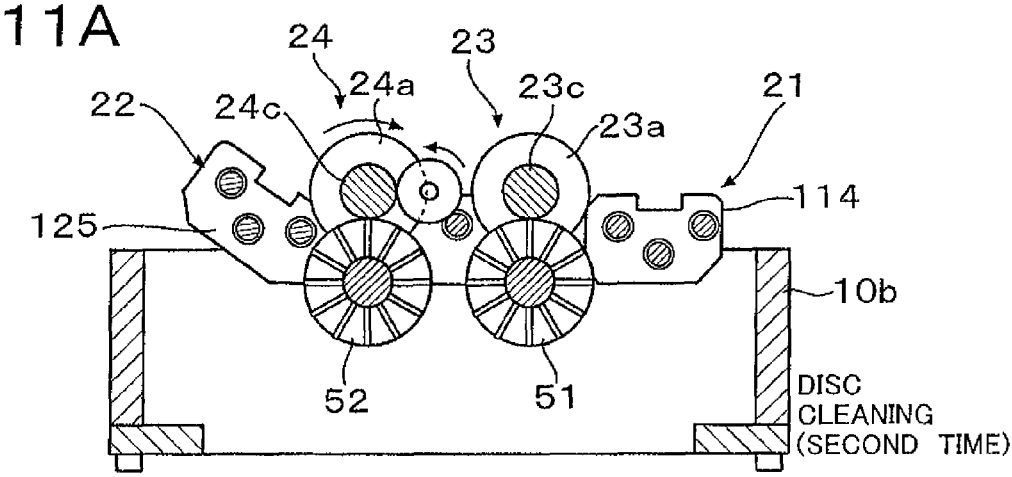
FIG. 11A shows a disc receiving mechanism rotated clockwise by about 45° from the state shown in FIG. 9D.
Figure 11B:
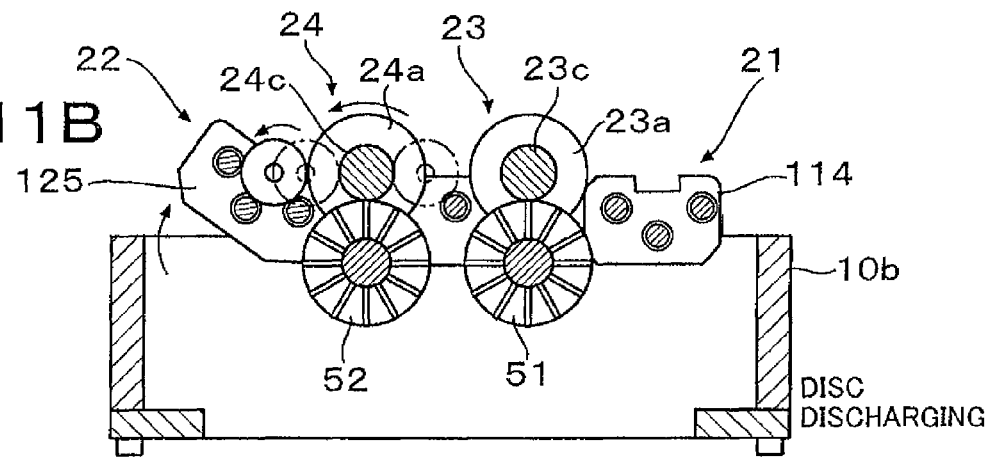
FIG. 11B shows a disc receiving shaft of the disc loading mechanism rotated clockwise.

The stepping motor 126 for the brackets 124 and 125 rotates the disc receiving shaft 121 clockwise by about 45° oppositely to the disc loading mechanism 21 (FIG. 11B). The disc receiving mechanism 22 receives the n discs 1 simultaneously from the rotary unit 24, which is rotating. After the discs are received by the disc receiving mechanism 22, the stepping motor 126 rotates the disc receiving mechanism 22 counterclockwise to return the latter to the original position which is the disc unloading position. The discs 1 held by the disc receiving mechanism are derived by a disc receiving hand 19b (FIG. 11C) similar to the disc receiving hand 19a.

Now, an operation for simultaneously cleaning the n discs 1 will be described with reference to FIGS. 9A to 9D and FIGS. 11A to 11C.

The disc receiving hand 19a is arranged in the upper portion of the disc loading mechanism 21. The disc receiving hand 19a is moved vertically by the elevator mechanism (not shown) and puts the discs 1 simultaneously on the receiving space formed by the disc receiving shafts 111 and 112 of the disc loading mechanism 21 and the disc revolution stopper 16. The disc loading mechanism 21 holds the discs 1 in the circular grooves 16c (FIG. 7) and the circular grooves 116 (FIG. 7) at predetermined intervals (FIG. 9A).

The cleaning operation is started by rotating the rotary brush units 23 and 24 clockwise. Cleaning agent is jetted from the cleaning nozzles 28, 28a and 28b. Then, the disc loading mechanism 21 is rotated counterclockwise by about 90° about the disc revolution stopper 16. At this time, the core rollers 23b of the rotary brush unit 23 are rotated clockwise. Then, the discs 1 are simultaneously inserted laterally to the contact portions of the brush surfaces of the adjacent disc brushes 23a of the rotary brush unit 23 (FIG. 9B).

After the insertion of the discs 1 to the rotary brush unit 23 is completed, the disc loading mechanism 21 is rotated clockwise and returned to the original position (FIG. 9C). Revolution of the discs 1 on the rotary brushes is prevented by the disc revolution stopper 16 and the discs 1 rotate counterclockwise and the cleaning is continued.

When the cleaning of the discs 1 is ended, the discs 1 are transported from the rotary brush unit 23 to the rotary brush unit 24. As shown in FIG. 9D, the core rollers 23b of the rotary brush unit 23 is rotated counterclockwise first. In this case, the lowest points or in the vicinity thereof of the outer peripheries of the discs 1 come in contact with the disc revolution stopper 17 of the rotary brush unit 24 and the discs 1 reach the disc positions on the left side of the outer peripheries of the rotary brush unit 23 shown by chain lines in FIG. 9D. Then, the discs 1 move to the side of the rotary brush unit 24 by passing over the disc revolution stopper 17 and are inserted to the rotary brush unit 24 (see the position of disc shown by solid lines in FIG. 9D).

The discs are inserted to the rotary brush unit 24 by passing over the disc revolution stopper 17. That is, the disc revolution stopper 17 is provided in the position of the lowest point of the outer peripheries of the discs 1 (or in the position of the vicinity of the lowest point) and a position close to the outer peripheries of the disc brushes 23a of the rotary brush unit 23 such that the disc revolution stopper 17 is engaged with the discs at or in the vicinity the lowest points of the outer peripheries of the discs. Therefore, the discs 1 pass over the disc revolution stopper 17 with the counterclockwise rotation of the disc brushes 23a and are pushed out to the side of the rotary brush unit 24.

Figure 10:
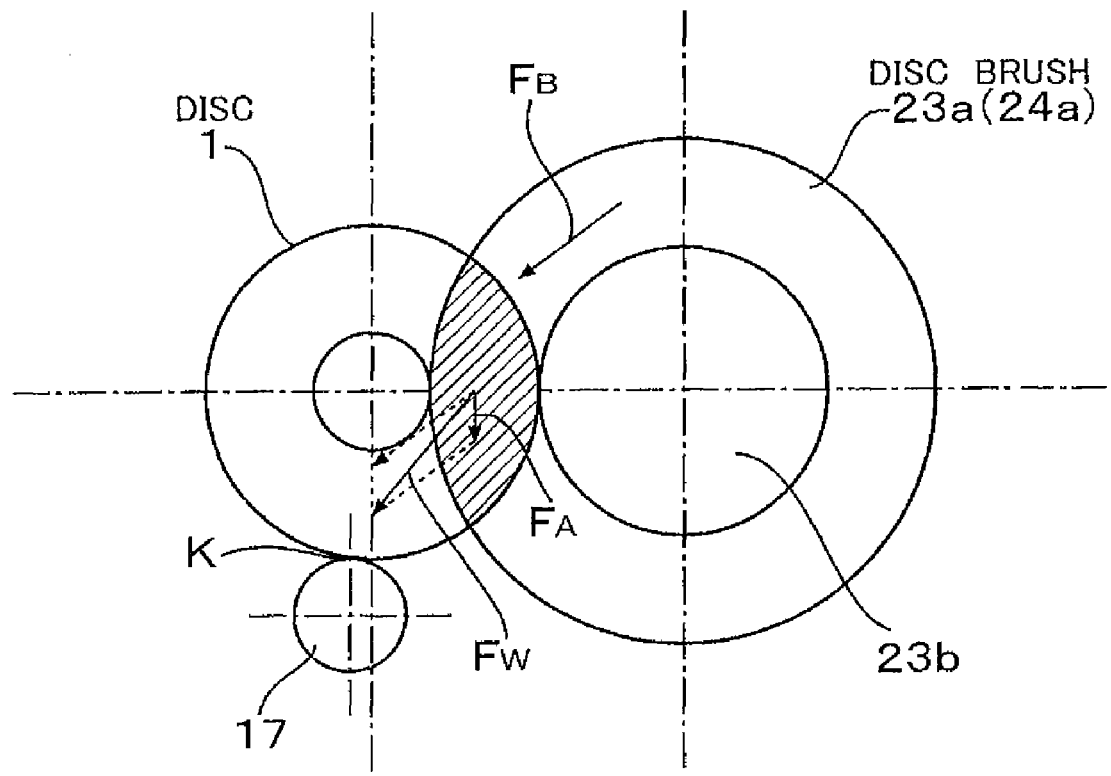
FIG. 10 shows an unloading of the inserted disc from a rotary brush unit in the embodiment shown in FIG. 6.

This operation will be described in more detail with reference to FIG. 10.

As shown in FIG. 9D, the center of the disc revolution stopper 17 is close to the centers of the discs 1 the outer peripheries of which contact the disc revolution stopper 17. The disc revolution stopper 17 is slightly deviated outside from the center of the disc 1 as shown in FIG. 10. Assuming the engaging point between the disc revolution stopper 17 and the outer periphery of the disc 1 is K, the disc brush 23a applies frictional force FA to the disc 1, so that the disc 1 is rotated counterclockwise. Simultaneously, pushing force FB is applied to an upper peripheral side surface of the disc 1 pinched between the adjacent disc brushes 23a. Force FB is also effective to rotate the disc 1 to thereby push it out.

Force FA is frictional force smaller than FB, which does not damage the disc 1. When force FW, which is a resultant force of forces FA and FB, is directed toward a position above the engaging point K, the discs 1 contact the disc revolution stopper 17 and are pushed out from the rotary brush unit 23. Therefore, the disc revolution stopper 17 is set in the position in which the above mentioned relation is established and the n discs 1 are moved from the rotary brush unit 23 to the rotary brush unit 24.

Incidentally, when the disc revolution stopper 17 is a rotatable roller, it is possible to eject the discs out even when force FW is directed to a position slightly lower than the engaging point K. This is because, since the discs 1 are rotating clockwise, the roller of the disc revolution stopper 17 rotates counterclockwise and the pushing force applied to the discs 1 is increased by this counterclockwise rotation of the disc revolution stopper 17.

A relation between the shaft 121 of the disc receiving mechanism 22 and the rotary brush unit 24 is similar to the above mention relation and the (n) discs 1 are moved from the rotary brush unit 24 to the disc receiving mechanism 22 through the shaft 121 by the counterclockwise rotation of the rotary brush unit 24.

Conversely, when force FW is directed to a position lower than the engaging point K, the discs 1 are not pushed out. This relation exists between the disc revolution stopper 16 and the discs 1 on the side of the disc loading mechanism 21.

That is, the disc revolution stopper 16 engages with the outer peripheries of the discs 1 at a position higher than the lowest point of the outer peripheries of the discs 1. Therefore, force FW is pointed to a position lower than the engaging point K, so that the discs 1 do not pass over the disc revolution stopper 16 while the disc cleaning is being performed. The position of the disc revolution stopper 16 is set such that the discs 1 are held by the disc revolution stopper 16 according to the above mentioned positional relation between the disc revolution stopper 16 and the rollers 23b (the grooves 25a between the core rollers 23b).

The positional relation between the disc revolution stopper 17 and the rotary brush unit 24 is similar to that between the disc revolution stopper 16 and the rotary brush unit 23.

The above explanation with using force FW is theoretical. Since the point of application of force FB is practically positioned at a high point passing through the centers of the discs 1 in the outer peripheries of the discs 1, the discs 1 are pushed out easily by force FB.

Therefore, the discs 1 pass over the disc revolution stopper 17 and are moved to the side of the rotary brush unit 24. Since the rotary brush unit 24 is rotated clockwise during this movement, the discs 1 are inserted to the contact portions S as shown in FIG. 9D. The clockwise revolution of the discs 1 due to the rotary brush unit 24 is prevented by the disc revolution stopper 17 and the discs 1 are rotated counterclockwise by the rotary brush unit 24. Therefore, the discs 1 are cleaned by the rotary brush unit 24.

During this operation, the n discs are loaded in the rotary brush unit 23 by the disc loading mechanism 21, held at the respective disc revolution stoppers 16 and 17 between the disc revolution stopper 16 and the rotary brush unit 23 and cleaned by the rotary brush units 23 and 24, as shown in FIG. 7. The discs cleaned by the rotary brush unit 24 are unloaded by the disc receiving mechanism 22 as shown in FIG. 7.

FIG. 11 explains the ejecting operation of the discs, which are cleaned in the two steps, from the rotary brush unit 24.

When the disc cleaning by the rotary brush unit 24 is completed, the disc receiving mechanism 22 is rotated clockwise by about 45° from the state shown in FIG. 9D to the state shown in FIG. 11A. Thereafter, the rollers 24b of the rotary brush unit 24 are rotated counterclockwise and the cleaned discs 1 are transferred to the disc receiving mechanism 22 (FIG. 11B).

Figure 11C:
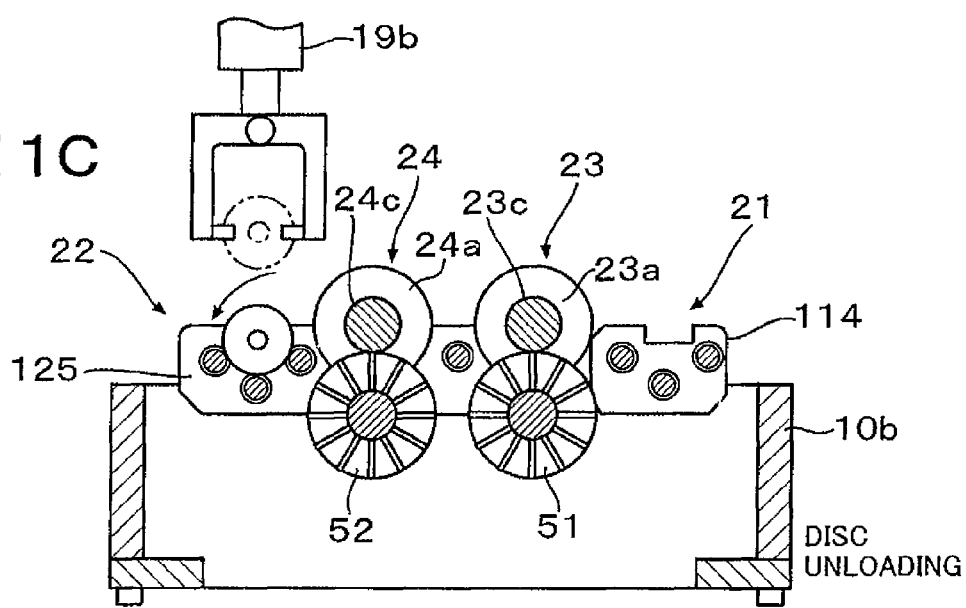
FIG. 11C shows the disc delivering hand arranged in an unloading position.

When the disc receiving mechanism 22 receives the discs 1, it rotates counterclockwise by about 45° to the original position (FIG. 11C).

In the position shown in FIG. 11C, the cleaned discs held by the disc receiving mechanism 22 are derived by the disc delivering hand 19b provided on the unloading side similar to the disc delivering hand 19a and are transported from the cleaning device 20 to the next drying step.

Incidentally, the rotary brush units 23 and 24 are provided in parallel in this embodiment and it is possible to clean the discs by the respective rotary brush units by delivering the discs 1 from the rotary brush unit 23 to the rotary brush unit 24. As a result, it is possible to improve the cleaning efficiency.

Incidentally, one of the rotary brush units 23 and 24 may be removed.

As described hereinbefore, the core rollers 23b and 24b are independently provided correspondingly to the rotary brushes. However, the core roller may be a single sleeve provided by integrating a plurality of core rollers.

Further, the brush is not limited to the sponge member in this embodiment.

Further, although the discs are inserted to the rotary brush unit from the upper side or lateral sides, the inserting direction may not be limited thereto. The discs can be held by force, which is small enough to prevent them from dropping from the rotary brush unit. Therefore, when mass of a disc is small, it can be inserted in a state in which it hangs down.

In the described embodiment, the discs are inserted to the contact positions S between adjacent brushes. However, it is possible to provide gaps between adjacent brushes as the contact positions S, insert the discs to the gaps and close the gaps to push the adjacent brushes toward the discs.

Further, in the embodiments shown in FIGS. 1 and 5, the roller 3a on which the sleeves are mounted is a single roller. However, the roller 3a may be constructed as a plurality of rollers.

The invention claimed is:

1. A disc cleaning mechanism for cleaning a plurality of discs by contacting a plurality (n) of rotating brushes with surfaces of said plurality of discs, and rotating the rotating brushes, comprising:
a rotary brush assembly having a rotary shaft and said plurality (n) of rotating brushes mounted on said rotary shaft at equal intervals such that said discs are inserted to positions between adjacent ones of said rotating brushes; and
a disc revolution stopper that prevents revolution of said discs inserted to said positions about said rotary shaft with rotation of said rotary brush assembly by engagement of said disc revolution stopper with outer peripheries of said discs and that allows rotation of said discs by disengagement of said disc revolution stopper,
wherein each of said rotating brushes is selected from the group consisting of a disc shaped brush, a circular shaped brush and a cylindrical shaped brush.

2. A disc cleaning mechanism as claimed in claim 1, wherein said disc revolution stopper includes a shaft and at least one roller which is provided along said shaft.

3. A disc cleaning mechanism as claimed in claim 2, wherein n is an integer equal to or larger than 3, said adjacent ones of said rotating brushes contact with surfaces of each of said discs and grooves are formed in said rotary shaft corresponding to positions between said adjacent rotating brushes.

4. A disc cleaning mechanism as claimed in claim 3, further comprising a rotary arm, wherein said disc revolution stopper is fixed to said rotary arm and contacts said outer peripheries of said discs by rotation of said rotary arm.

5. A disc cleaning mechanism as claimed in claim 4, further comprising a guide roller provided in parallel to said disc revolution stopper and fixed to said rotary arm, wherein each said disc inserted between adjacent brushes is chucked at three points by said guide roller, said disc revolution stopper and said rotary shaft.

6. A disc cleaning mechanism as claimed in claim 1, wherein each said rotating brush includes a core roller, which has an uneven peripheral portion formed on an outer periphery thereof, and a core of each said brush, said rotary shaft is inserted to said core rollers, each said brush has a center opening having an uneven peripheral portion provided as an inner periphery of said center opening, said uneven peripheral portions of said core roller and said rotating brush form a spline joint.

7. A disc cleaning mechanism as claimed in claim 2, wherein said disc revolution stopper extends along said rotary shaft and is fixed to a position adjacent to said outer peripheries of said discs.

8. A disc cleaning device for cleaning a plurality of discs by contacting a plurality of rotating brushes with surfaces of said plurality of discs, comprising:
a rotary brush having a rotary shaft on which said plurality of rotating brushes are mounted, each of said discs being inserted to positions between adjacent ones of said rotating brushes; and
a disc revolution stopper that prevents revolution of each of said discs inserted to said positions about said rotary shaft with rotation of said rotary brushes by engagement with outer peripheries of said discs and that allows rotation of said discs by disengagement with outer peripheries of said discs,
wherein each of said rotary brushes is selected from the group consisting of a disc shaped brush, a circular shaped brush and a cylindrical shaped brush.

9. A disc cleaning device as claimed in claim 8, further comprising a disc loading mechanism, wherein said disc loading mechanism is provided along said rotary shaft and adjacent to said brushes, said disc loading mechanism receives a plurality of discs loaded from externally and standing along a cross sectional direction of said rotating brushes and inserted between said brushes by rotating said discs standing using a point outside said discs as a center toward positions between adjacent brushes.

10. A disc cleaning device as claimed in claim 9, wherein said disc loading mechanism has a plurality of shafts for receiving said discs in standing state by engagement between outer peripheries of said shafts and output peripheries of said discs, and said discs are rotated by rotation of said disc loading mechanism about one of the plurality of said shafts as said center point while supported by the remaining shafts.

11. A disc cleaning device as claimed in claim 10, wherein said one shaft as said center point is said disc revolution stopper and said brushes are rotating when said discs are inserted between said brushes.

12. A disc cleaning device as claimed in claim 11, wherein the plurality of said shafts are two rollers provided along an axial direction of said rotary shaft and said disc revolution stopper, said disc revolution stopper has a roller provided along the axial direction of said rotary shaft, one of said two rollers and said disc revolution stopper are provided in parallel below said center of said rotary shaft, the remaining roller is provided between and below said one roller and said disc revolution stopper and a disc receiving space is constructed with said two rollers and said disc revolution stopper.

13. A disc cleaning device as claimed in claim 8, further comprising circular plates for cleaning said rotating brushes, wherein said circular plates are inserted between said rotating brushes, which do not overlap with the positions of the rotating brushes to which said discs are inserted.

14. A disc cleaning device as claimed in claim 8, wherein said rotating brushes are formed of porous sponge material and said circular plates have a plurality of holes, respectively.

* * * * *